(12) United States Patent
Nazarian et al.

(10) Patent No.: US 11,393,529 B2
(45) Date of Patent: Jul. 19, 2022

(54) CAPACITANCE MEASUREMENT AND APPARATUS FOR RESISTIVE SWITCHING MEMORY DEVICES

(71) Applicant: Crossbar, Inc., Santa Clara, CA (US)

(72) Inventors: Hagop Nazarian, San Jose, CA (US); Cung Vu, San Jose, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 16/995,718

(22) Filed: Aug. 17, 2020

(65) Prior Publication Data

US 2022/0005527 A1 Jan. 6, 2022

Related U.S. Application Data

(60) Provisional application No. 62/888,000, filed on Aug. 16, 2019.

(51) Int. Cl.
*G11C 16/04* (2006.01)
*G11C 13/00* (2006.01)
*G01R 27/26* (2006.01)

(52) U.S. Cl.
CPC ...... *G11C 13/0069* (2013.01); *G01R 27/2605* (2013.01); *G11C 2013/0092* (2013.01)

(58) Field of Classification Search
CPC ........ G11C 13/0069; G11C 2013/0092; G01R 27/2605
See application file for complete search history.

(56) References Cited

U.S. PATENT DOCUMENTS

| | | | | |
|---|---|---|---|---|
| 5,436,583 | A * | 7/1995 | Fujii | H03K 4/066 327/165 |
| 9,659,642 | B1 * | 5/2017 | Nguyen | G11C 13/004 |
| 10,134,469 | B1 * | 11/2018 | Liu | G11C 13/0033 |
| 10,475,511 | B1 * | 11/2019 | Liu | G11C 13/0061 |

\* cited by examiner

*Primary Examiner* — Pho M Luu
(74) *Attorney, Agent, or Firm* — Wegman Hessler

(57) ABSTRACT

A semiconductor device includes two-terminal memory devices characterized by a range of program voltages and a first capacitance, wherein the two-terminal memory devices are coupled in parallel between ground and a first common node, a first capacitor having a second capacitance, coupled between ground and a second common node, a voltage source configured to provide an input voltage lower than the range of program voltages, a first operational amplifier including an inverting input, a non-inverting input, and an output, wherein the non-inverting input is coupled to the first voltage source, wherein the inverting input is coupled to a third common node, and wherein the output is coupled to a fourth common node, a first resistance device coupled between the third common node and the fourth common node, and wherein the first common node is coupled to the second common node and the third common node.

20 Claims, 13 Drawing Sheets

NON-VOLATILE RESISTIVE SWITCHING DEVICE
310

ReRAM REPRESENTATIVE CURRENT v. VOLTAGE RESPONSE
320

VOLATILE RESISTIVE SWITCHING SELECTOR DEVICE
410

SELECTOR REPRESENTATIVE CURRENT v. VOLTAGE RESPONSE
420

SERIES COMBINATION OF SELECTOR DEVICE
+ NV RESISTIVE SWITCHING DEVICE
510

ReRAM+SELECTOR REPRESENTATIVE
CURRENT v. VOLTAGE RESPONSE
520

CAPACITANCE MEASUREMENT AND APPARATUS FOR RESISTIVE SWITCHING MEMORY DEVICES

CROSS-REFERENCE TO RELATED APPLICATION

The present application for patent claims the benefit of U.S. Provisional Application No. 62/888,000 filed on Aug. 16, 2019 and entitled "RERAM CAPACITANCE MEASUREMENT AND APPARATUS", which is hereby incorporated by reference herein in its entirety and for all purposes.

INCORPORATION BY REFERENCE

U.S. patent application Ser. No. 14/588,185 filed Dec. 31, 2014 and entitled "SELECTOR DEVICE FOR TWO-TERMINAL MEMORY", U.S. patent application Ser. No. 14/717,185 filed May 20, 2015 and entitled "NON-VOLATILE MEMORY CELL UTILIZING VOLATILE SWITCHING TWO TERMINAL DEVICE AND A MOS TRANSISTOR", U.S. patent application Ser. No. 15/066,504 filed Mar. 10, 2016 and entitled "SELECTOR-BASED NON-VOLATILE CELL FABRICATION UTILIZING IC-FOUNDRY COMPATIBLE PROCESS", U.S. patent application Ser. No. 14/755,998 filed Jun. 30, 2015 and entitled "SENSING A NON-VOLATILE MEMORY DEVICE UTILIZING SELECTOR DEVICE HOLDING CHARACTERISTICS" and U.S. patent application Ser. No. 15/469,179 filed Mar. 24, 2017 and entitled "SWITCHING BLOCK CONFIGURATION BIT COMPRISING A NON-VOLATILE MEMORY CELL" are each hereby incorporated by reference herein in their respective entireties and for all purposes.

FIELD OF THE INVENTION

Embodiments of the present disclosure pertain to electronic memory structures; for example, various embodiments disclose apparatuses and methods for measuring capacitance of electronic memory devices.

BACKGROUND

The inventors are cognizant of a variety of solid state memory structures utilized for modern electronic memory and computing devices. Tight control over the processes utilized to fabricate modern solid state memory structures is important to create properly operating memory structures, as well as achieve close uniformity among multiple devices.

In various embodiments, the inventors of the present disclosure desire to minimize the impact of variations in semiconductor fabrication processes. Process variations can differ among multiple semiconductor wafers produced by a process, or among dies within a single wafer(s) or both. In turn these process variations can lead to variations in performance of memory structures on a given die. Performance variations outside of acceptable fabrication ranges are generally considered bad parts, and discarded. This reduction in acceptable yield of parts increases overhead cost of the process as a whole. While some performance variations are small enough to remain within target operating specifications, they can still have detrimental impact on memory performance over time.

In light of the above, the inventors have desired new mechanisms for mitigating the effects of process variations that overcome current challenges in the art for processing existing memory structures.

SUMMARY

The following presents a simplified summary of the subject disclosure in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

Various embodiments of the present invention are directed toward fabrication of semiconductor two-terminal memory devices, comprising an array(s) of non-volatile ReRAM memory currently under development by Crossbar, Inc., the assignee of the present application. Further embodiments are directed toward fabrication of semiconductor memory devices including volatile two-terminal resistive switching devices, such as a selector device (e.g., a FAST® selector device), also under development by Crossbar, Inc. Still further embodiments are directed toward fabrication of semiconductor memory devices including an array(s) of very high-speed non-volatile memory devices respectively comprising a transistor, a selector device and an optional capacitor. Other embodiments are directed towards fabrication of other two-terminal memory devices such as a filamentary memory device, a magneto-resistive memory device, a phase change memory device, a carbon nanotube memory device, a conductive bridging memory device, a silicon sub-oxide memory device, a metal oxide memory device, or the like.

In various types of two-terminal memory devices and for more advanced semiconductor processing nodes, variation in the thickness of a memory layer can impact operation of the memory devices and peripheral circuitry. Due to process variations, the thickness of the memory layer may be different between two-terminal memory devices within the same die, and the thickness of the memory layer may be different between different dies across a wafer. The different thicknesses in the memory layer may have an effect upon the characteristics of the two-terminal memory, such as program, read, and erase voltages; program, read and erase speed; program, read and erase characteristics; and the like.

In some cases, differences in memory layer thicknesses may be compensated for by the setting of trim values, and other parameters during a program, read, or erase cycle. In other cases, the memory layer thickness may be too far out of specification to compensate for trim values, and such devices may be considered defective dies. In either event, the capacity to accurately measure these variations in memory layer thickness during fabrication can significantly improve quality control of fabrication processes, identify devices that operate within acceptable ranges, identify proper trim values to assist with proper operation from wafer to wafer and die to die, as well as optimize fabrication costs generally.

Because electrical characteristics (e.g., program, read and erase conditions) of the memory layers may vary depending on changes in certain thicknesses of the memory layers, various embodiments are directed to effective and efficient mechanisms for determining the thickness of memory layers of two-terminal memory devices. The thicknesses may be directly measured via cross-section images of devices, in some embodiments. However, such techniques are expensive and impractical on a production line. In other embodiments, thicknesses may be indirectly determined by the measurement of parasitic capacitance of such layers. Parasitic capacitance may be measured by connecting electronic equipment, external to a die or wafer, to electrical connection points on surfaces of the die/wafer in some embodiments. These embodiments can be cumbersome and error prone if the contact points on the die/wafer surface are small, or alternatively can consume excessive die/wafer surface area if the contacts are made large. These can also be impractical on a production line. Further, different portions of a memory layer or multiple memory layers may not be selectively accessible with external contact points. Accordingly, indirect measurement of memory layer thickness within a semiconductor die or wafer is desired, and particularly indirect measurement that facilitates accurate and reproducible measurements in a modern, large volume production setting.

Some disclosed embodiments provide a circuit on-die that can be selectively connected to different groups of two-terminal resistive switching devices, to measure parasitic capacitance of the resistive switching devices from within the die itself. In some embodiments, the circuit can be integrated within or among peripheral circuitry controlling access to an array of resistive switching devices (e.g., see FIG. 12, infra), can be fabricated at least in part on a substrate of a die, at least in part within memory layers of the die, or other portions of the die or a suitable combination of the foregoing. In one or more embodiments, the circuit can be a resistance-capacitance (RC) circuit that outputs a frequency that varies as a function of the parasitic capacitance of a resistive switching device(s) coupled to the RC circuit. In further embodiments, the present disclosure can provide multiple circuits on-die to measure different portions of a memory array(s), on the die. In still other embodiments, the present disclosure can provide multiple circuits on different dies of a wafer to test memory layer uniformity across different portions of the wafer.

In an embodiment(s), the present disclosure provides a semiconductor device. The semiconductor device can comprise a first plurality of two-terminal memory devices, wherein each of the two-terminal memory devices is characterized by a program voltage within a range of program voltages, wherein the first plurality of two-terminal memory devices is associated with a first capacitance, and wherein the first plurality of two-terminal memory devices is selectively coupled in parallel between ground and a first common node. Further, the semiconductor device can comprise a first capacitor coupled between ground and a second common node, wherein the first capacitor is characterized by a second capacitance, and a first voltage source configured to provide a first input voltage, wherein the first input voltage is lower than the range of program voltages. Still further, the semiconductor device can comprise a first operational amplifier including an inverting input, a non-inverting input, and an output, wherein the non-inverting input is coupled to the first voltage source, wherein the inverting input is coupled to a third common node, and wherein the output is coupled to a fourth common node. Moreover, the semiconductor device can comprise a first resistance device coupled between the third common node and the fourth common node, wherein the first common node is coupled to the second common node and the third common node.

Further embodiments of the present disclosure provide a method for operating a semiconductor device. The method can comprise closing a first switch and coupling a first plurality of two-terminal memory devices to an inverting input of a first operational amplifier, wherein each of the first plurality of two-terminal memory devices is characterized by a program voltage within a first range of program voltages, wherein a first capacitor is coupled between the inverting input of the first operational amplifier and ground, and wherein a first resistance device is coupled between the inverting input of the first operational amplifier and an output of the first operational amplifier. In addition to the foregoing, the method can comprise providing with a first voltage source, a first input voltage to a non-inverting input of the first operational amplifier, wherein the first input voltage is less than a minimum program voltage from the first range of program voltages. The method can further comprise outputting with the first operational amplifier, a first signal, wherein the first signal is characterized by a first oscillating frequency, wherein the first oscillating frequency is responsive to a first capacitance associated with the first plurality of two-terminal memory devices. Still further, the method can comprise measuring a frequency value of the first oscillating frequency and storing in a memory, an indicator associated with the first oscillating frequency measurement.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Introduction

Figure 1:
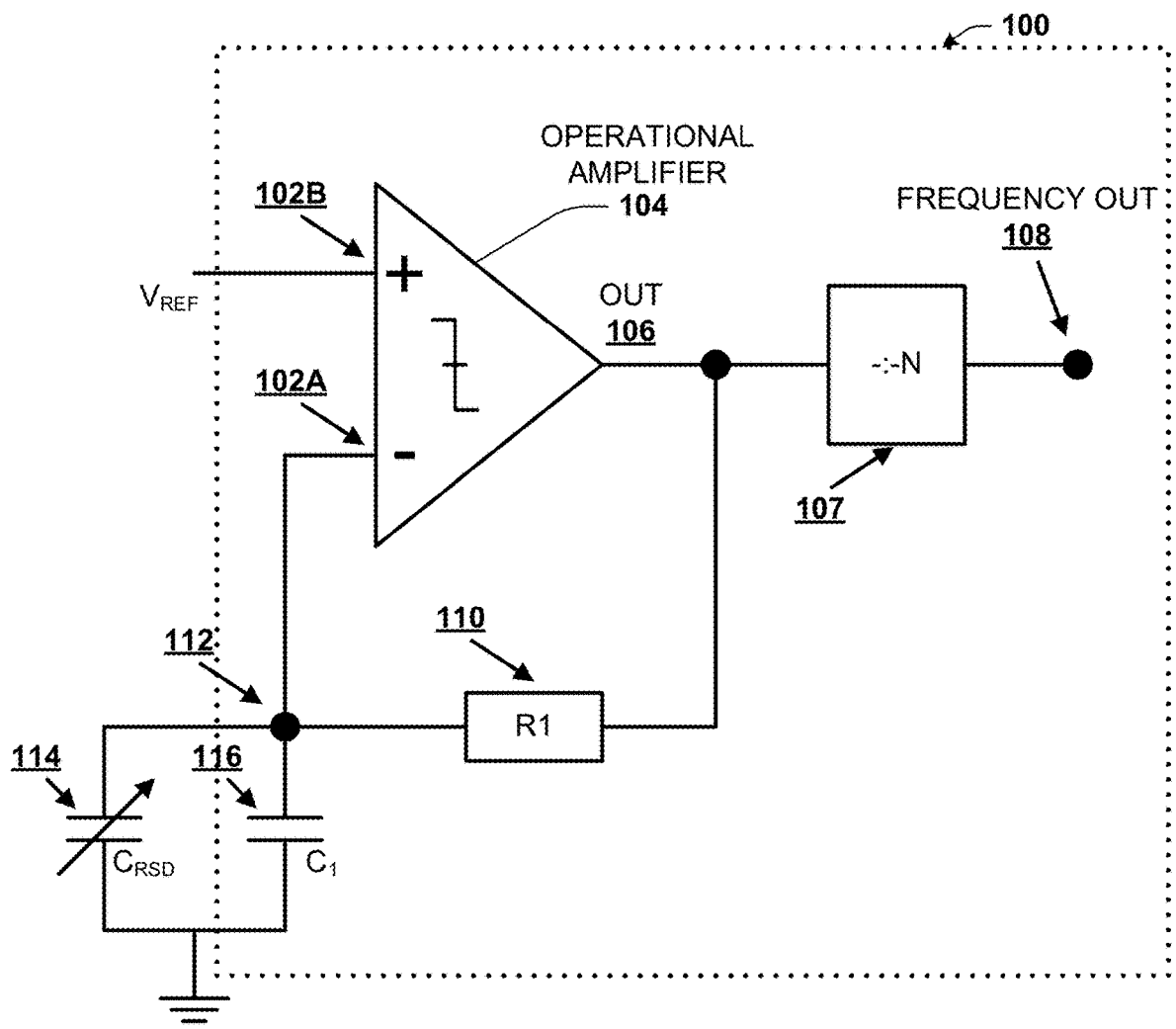
FIG. 1 depicts a schematic diagram of an example circuit for determining a capacitance of one or more resistive switching devices (RSDs), in disclosed embodiments.

As the name implies, a two-terminal resistive switching device has two terminals or electrodes. Herein, the terms "electrode" and "terminal" are used interchangeably; moreover, a two-terminal resistive switching device includes a non-volatile two-terminal memory device as well as a volatile two-terminal switching device. Generally, a first electrode of a two-terminal resistive switching device is referred to as a "top electrode" (TE) and a second electrode of the two-terminal resistive switching device is referred to as a "bottom electrode" (BE), although it is understood that electrodes of two-terminal resistive switching devices can be according to any suitable arrangement, including a horizontal arrangement in which components of a memory cell are (substantially) side-by-side rather than overlying one another. Situated between the TE and BE of a two-terminal resistive switching device is typically an interface layer sometimes referred to as a switching layer, a resistive switching medium (RSM) or a resistive switching layer (RSL); such devices are not limited to these layers, however, as one or more barrier layer(s), adhesion layer(s), ion conduction layer(s), seed layer(s) or the like, as disclosed herein, disclosed within any publication incorporated by reference herein, or as generally understood and utilized in the art, may be included between or adjacent one or more of the TE, the BE or the interface layer consistent with suitable operation of such device. Various embodiments of the present disclosure provide an array of memory devices comprising a circuit fabricated on-die with the array of memory devices for determining capacitance of one or more two-terminal resistive switching devices of the array. Also provided is an architecture to control and operate the array of memory devices.

Composition of memory cells, generally speaking, can vary per device with different components selected to achieve desired characteristics (e.g., volatility/non-volatility, on/off current ratio, switching time, read time, memory durability, program/erase cycle, and so on). One example of a filamentary-based device can comprise: a conductive layer, e.g., metal, metal-alloy, metal-nitride, (e.g., comprising TiN, TaN, TiW, or other suitable metal compounds), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.)), a resistive switching layer (RSL) and an active metal-containing layer capable of being ionized. Under suitable conditions, the active metal-containing layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer. A memory cell having such characteristics may be described as a filamentary-based device.

A RSL (which can also be referred to in the art as a resistive switching media (RSM)) can comprise, e.g., an undoped amorphous Si-containing layer, a semiconductor layer having intrinsic characteristics, a silicon nitride (e.g., SiN, $Si_3N_4$, $SiN_x$, etc.), a Si sub-oxide (e.g., $SiO_x$ wherein x has a value between 0.1 and 2), a Si sub-nitride, a metal oxide, a metal nitride, a non-stoichiometric silicon compound, and so forth. Other examples of materials suitable for the RSL could include $Si_xGe_yO_z$ (where x, y and z are respective suitable positive numbers), a silicon oxide (e.g., $SiO_N$, where N is a suitable positive number), a silicon oxynitride, an undoped amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number) and so forth, a nitride (e.g., AlN, SiN), or a suitable combination thereof.

In some embodiments, a RSL employed as part of a non-volatile memory device (non-volatile RSL) can include a relatively large number (e.g., compared to a volatile selector device) of material voids or defects to trap neutral metal particles (at least at low voltage) within the RSL. The large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation. In other embodiments, a RSL employed for a volatile selector device (volatile RSL) can have very few material voids or defects for trapping particles. Because of the few particle-trapping voids/defects, a conductive filament formed in such an RSL can be quite thin (e.g., one to a few particles wide depending on field strength, particle material or RSL material, or a suitable combination of the foregoing), and unstable absent a suitably high external stimulus (e.g., an electric field, voltage, current, joule heating, or a suitable combination thereof). Moreover, the particles can be selected to have high surface energy, and good diffusivity within the RSL. This leads to a conductive filament that can form rapidly in response to a suitable stimulus, but also deform quite readily, e.g., in response to the external stimulus dropping below a deformation magnitude (which can be lower than a formation magnitude of the external stimulus associated with forming the volatile conductive filament, e.g., in response to a current flowing through the selector device; see U.S. patent application Ser. No. 14/755,998 incorporated by reference hereinabove). Note that a volatile RSL and conductive filament for the selector device can have different electrical characteristics than a conductive filament and non-volatile RSL for the non-volatile memory device. For instance, the selector device RSL can have higher material electrical resistance, and can have higher on/off current ratio, among others.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum(Ta), iron (Fe), manganese (Mn), tungsten (W), vanadium (V), cobalt (Co), platinum (Pt), hafnium (Hf), and palladium (Pd). Other suitable conductive materials, as well as compounds, nitrides, oxides, alloys, or combinations of the foregoing or similar materials can be employed for the active metal-containing layer in some aspects of the subject disclosure. Further, a non-stoichiometric compound, such as a non-stoichiometric metal oxide or metal nitride (e.g., AlOx, AlNx, CuOx, CuNx, AgOx, AgNx, and so forth, where x is a suitable positive number 0<x<2, which can have differing values for differing ones of the non-stoichiometric compounds) or other suitable metal compound can be employed for the active metal-containing layer, in at least one embodiment.

In one or more embodiments, a disclosed filamentary resistive switching device can include an active metal layer comprising a metal nitride selected from the group consisting of: TiNx, TaNx, AlNx, CuNx, WNx and AgNx, where x is a positive number. In a further embodiment(s), the active metal layer can comprise a metal oxide selected from the group consisting of: TiOx, TaOx, AlOx, CuOx, WOx and AgOx. In yet another embodiment(s), the active metal layer can comprise a metal oxi-nitride selected from the group consisting of: TiOaNb, AlOaNb, CuOaNb, WOaNb and AgOaNb, where a and b are positive numbers. The disclosed filamentary resistive switching device can further comprise a switching layer comprising a switching material selected from the group consisting of: SiOy, AlNy, TiOy, TaOy, AlOy, CuOy, TiNx, TiNy, TaNx, TaNy, SiOx, SiNy, AlNx, CuNx, CuNy, AgNx, AgNy, TiOx, TaOx, AlOx, CuOx, AgOx, and AgOy, where x and y are positive numbers, and y is larger than x. Various combinations of the above are envisioned and contemplated within the scope of embodiments of the present invention.

In one example, a disclosed filamentary resistive switching device comprises a particle donor layer (e.g., the active metal-containing layer) comprising a metal compound and a resistive switching layer. In one alternative embodiment of this example, the particle donor layer comprises a metal nitride: MNx, e.g., AgNx, TiNx, AlNx, etc., and the resistive switching layer comprises a metal nitride: MNy, e.g., AgOy, TiOy, AlOy, and so forth, where y and x are positive numbers, and in some cases y is larger than x. In an alternative embodiment of this example, the particle donor layer comprises a metal oxide: MOx, e.g., AgOx, TiOx, AlOx, and so on, and the resistive switching layer comprises a metal oxide: MOy, e.g., AgOy, TiOy, AlOy, or the like, where y and x are positive numbers, and in some cases y is larger than x. In yet another alternative, the metal compound of the particle donor layer is a MNx (e.g., AgNx, TiNx, AlNx, etc.), and the resistive switching layer is selected from a group consisting of MOy (e.g., AgOy, TiOy, AlOy, etc.) and SiOy, where x and y are typically non-stoichiometric values, or vice versa in a still further embodiment.

As utilized herein, variables x, a, b, and so forth representative of values or ratios of one element with respect to another (or others) in a compound can have different values suitable for respective compounds, and are not intended to denote a same or similar value or ratio among the compounds. Some details pertaining to embodiments of the subject disclosure similar to the foregoing example(s) can be found in the following U.S. patent applications that are licensed to the assignee of the present application for patent: application Ser. No. 11/875,541 filed Oct. 19, 2007 and application Ser. No. 12/757,921 filed Oct. 8, 2009; each of the foregoing patent applications are hereby incorporated by reference herein in their respective entireties and for all purposes in addition to those incorporated by reference elsewhere herein.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

In various embodiments, filamentary-based resistance switching devices can operate in a bipolar fashion, behaving differently in response to different polarity (or direction, energy flow, energy source orientation, etc.) external stimuli. For the volatile filamentary-based selector device, as an illustrative example, in response to a first polarity stimulus exceeding a first threshold voltage (or set of voltages), the filamentary selector device can change to a second resistance state from a first resistance state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), having the same or similar magnitude of threshold stimulus (though of opposite polarity or direction), or the like. In other embodiments, the third state can be distinct from the second state, either in terms of the measurable characteristic (e.g., different electrically conductivity value in response to the reverse polarity as compared to the forward polarity) or in terms of threshold stimulus associated with transitioning out of the first state (e.g., a different magnitude of positive voltage required to transition to the second state, compared to a magnitude of negative voltage required to transition to the third state).

For bipolar operation of a non-volatile filamentary-based memory cell, a conductive path or a filament forms through a non-volatile RSL in response to a suitable program voltage applied across the memory cell. In particular, upon application of a programming voltage, metallic ions are generated from the active metal-containing layer and migrate into the non-volatile RSL layer. The metallic ions can occupy voids or defect sites within the non-volatile RSL layer. In some embodiments, upon removal of the bias voltage, the metallic ions become neutral metal particles and remain trapped in voids or defects of the non-volatile RSL layer. When sufficient particles become trapped, a filament is formed and the memory cell switches from a relatively high resistive state, to a relatively low resistive state. More specifically, the trapped metal particles provide the conductive path or filament through the non-volatile RSL layer, and the resistance is typically determined by a tunneling resistance through the non-volatile RSL layer. In some resistive-switching devices, an erase process can be implemented to deform the conductive filament, at least in part, causing the memory cell to return to the high resistive state from the low resistive state. More specifically, upon application of an erase bias voltage, the metallic particles trapped in voids or defects of the non-volatile RSL become mobile ions and migrate back towards the active metal layer. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in such memory cells.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

As mentioned above, applying a program voltage (also referred to as a "program pulse") to one of the electrodes of the two-terminal memory can cause a conductive filament to form in an interface layer (e.g., a RSL). By convention and as generally described herein, the TE receives the program pulse and the BE is grounded (or held at lower voltage or opposite polarity compared to the program pulse), but such is not intended to be limiting for all embodiments. Conversely, applying an "erase pulse" to one of the electrodes (generally a pulse of opposite polarity as the program pulse or to the opposite electrode as the program pulse) can break continuity of the filament, e.g., by driving the metal particles or other material that forms the filament back toward the active metal source. Properties of this conductive filament as well as its presence or absence affect the electrical characteristics of the two-terminal memory cell such as, for example, lowering the resistance and/or increasing conductance across the two terminals when the conductive filament is present as opposed to when not present.

Following program or erase pulses, a read pulse can be asserted. This read pulse is typically lower in magnitude relative to program or erase pulses and typically insufficient to affect the conductive filament and/or change the state of the two-terminal memory cell. By applying a read pulse to one of the electrodes of the two-terminal memory, a measured current (e.g., Ion) when compared to a predetermined threshold current can be indicative of the conductive state of the two-terminal memory cell. The threshold current can be preset based on expected current values in different states (e.g., high resistance state current; respective currents of one or more low resistance states, and so forth) of the two-terminal memory device, suitable for a given two-terminal memory technology. For example, when the conductive filament has been formed (e.g., in response to application of a program pulse), the conductance of the cell is greater than otherwise and the measured current (e.g., Ion) reading in response to the read pulse will be greater. On the other hand, when the conductive filament is removed (e.g., in response to application of an erase pulse), the resistance of the cell is high because the interface layer has a relatively high electrical resistance, so the conductance of the cell is lower and the measured current (e.g., Ioff) reading in response to the read pulse will be lower. By convention, when the conductive filament is formed, the memory cell is said to be in the "on-state" with a high conductance. When the conductive filament is not extant, the memory cell is said to be in the "off-state". A memory cell being in the on-state or the off-state can be logically mapped to binary values such as, e.g., "1" and "0". It is understood that conventions used herein associated with the state of the cell or the associated logical binary mapping are not intended to be limiting, as other conventions, including an opposite convention can be employed in connection with the disclosed subject matter. Techniques detailed herein are described and illustrated in connection with single-level cell (SLC) memory, but it is understood that the disclosed techniques can also be utilized for multi-level cell (MLC) memory in which a single memory cell can retain a set of measurably distinct states that represent multiple bits of information.

By mapping digital information to non-volatile resistance states of a two-terminal memory cell, digital information can be stored at such device. An electronic device containing many of these two-terminal memory cells can likewise store significant quantities of data. High density arrays are configured to contain as many memory cells as possible for a given area of chip space, thereby maximizing data storage capacity of a memory chip, or system-on-chip device.

For two-terminal memory formed at intersections of metal lines within a wafer (e.g., a crossbar array), the inventor(s) of the subject disclosure are cognizant of two general conventions for arrangement of the memory cells. A first convention is the 1T1R memory array, in which each memory cell is isolated from electrical effects (e.g., current, including leak path current(s)) of surrounding circuitry by an associated transistor. A second convention is the 1TnR memory array (n being a positive number greater than one), where a group of multiple memory cells is isolated from electrical effects of surrounding circuitry by one (or more) transistors. In the 1T1R context, individual memory cells can be configured to have high current suppression between memory cells, significantly reducing leakage path currents for the 1T1R memory array.

One example mechanism for connecting a 1T1R memory array includes a first terminal of a two-terminal resistive memory device connected to a drain of a transistor. A second terminal of the two-terminal resistive memory device can be connected to a bitline of the 1T1R memory array. The source of the transistor is grounded or used as a source for erase or program signals, depending on erase/programming conditions for the memory array. Another example mechanism involves a three-terminal memory including a transistor coupled to a volatile two-terminal resistive switching device. A first terminal of the volatile RSD is connected to a gate of the transistor, and a second terminal of the volatile RSD is connected to a voltage source. When activated, the volatile RSD permits charge to accumulate at the gate of the transistor, and when deactivated can trap that accumulated charge at the transistor gate. Other resistive switching device (RSD) circuits can be utilized within the scope of the present disclosure.

FIG. 1 illustrates an example of a circuit 100 according to various embodiments of the present invention. Such a circuit or suitable variations thereof can be included in a semiconductor die incorporating two-terminal memory cells. In some embodiments, such a circuit can be included in one die on a semiconductor wafer, a plurality of dies on the semiconductor wafer, or all dies on the semiconductor wafer. Circuit 100 can be configured to be selectively connected to one or more resistive switching devices (RSDs) 114 on a given die, to determine capacitance of the RSDs. From capacitance determinations, characteristics of a memory layer in which the RSDs are formed can be estimated or inferred. In general, RSDs 114 are two-terminal resistive switching devices, but three-terminal RSDs 114 incorporating a volatile selector RSD and a transistor (and optional capacitor) can be utilized a well.

FIG. 1 illustrates an operational amplifier 104 (OP AMP) with an inverting input 102A (−), a non-inverting input 102B (+), and an output 106 (out). A resistor R1 110 is connected between output 106 of operational amplifier 104 and the inverting input 102A. Further, a capacitor C1 116 is connected between the inverting input 102A and ground. In an embodiment, a terminal of capacitor 116 and resistor 110 are connected to respective nodes that are in turn connected to inverting input 102A. In at least one embodiment, these respective nodes can all be a single common node 112, as illustrated.

The inverting input 102A can also be connected to a RSD(s) 114 at a first terminal thereof. In an embodiment, two-terminal RSD(s) 114 can comprise a plurality of RSDs connected respectively in parallel between common node 112 and ground. In a further embodiment, the (two-terminal) RSD(s) 114 can be selectively connected to or disconnected from common node 112 and circuit 100 (e.g., by way of a switch, a multiplexer, or other suitable electrical connection; see FIG. 2, infra). Still further, non-inverting input 102B can be connected to a voltage source Vref, which can be configured to provide a selected voltage, voltage magnitude, voltage waveform, etc., to non-inverting input 102B. Output 106 if operational amplifier 104 is additionally coupled to a (frequency) divider, such as a divide by N divider circuit (÷/N; where N is a suitable positive number).

As mentioned above, a RSD(s) 114 is coupled at one terminal(s) thereof to inverting input 102A (e.g., by way of common node 112). The RSD(s) 114 can be in a non-conducting state when coupled to inverting input 102A to model an electrical capacitor, $C_{RSD}$. For nanometer scale RSD technologies, the capacitance of a single RSD can be quite small. In order to have reasonable accuracy in determining a capacitance value of RSD(s) 114, the capacitance of RSD(s) 114 should be within an order of magnitude of C1 116 (or any suitable value or range there between), and preferably within a range from about ⅓ to about 3 times the magnitude of C1 116, or any suitable range or value there between. However, variations from the stated value (or any stated value disclosed herein, except where evident from context to the contrary) within one to a few tenths of a stated voltage (e.g., 0.1 volts, 0.2 volts, 0.3 volts, a range of 0.1 volts-0.5 volts or a suitable value there between) or a few percent of a stated value (e.g., 1%-25%, 5-20%, 1-15%, 5-15%, or any suitable value there between, or any suitable percentage range there between) are considered within the meaning of the term "about" as applied in this context. It should be understood that "about", "approximately" or other term of degree utilized herein is intended to refer to variations, ranges or values specified herein, variations, ranges or values reasonably understood by one of ordinary skill to provide the same or similar function and operation as described for a given component of a described device, component or element of a device, or method or step thereof. Thus, terms of degree generally refer to values or ranges that one of ordinary skill in the art would understand to facilitate operation of the various embodiments as described.

To achieve a capacitance $C_{RSD}$ within a desirable range, a plurality of RSDs 114 can be connected in parallel to sum their respective capacitances to a larger combined $C_{RSD}$. Where two-terminal RSDs 114 include multiple resistive switching devices, such devices can be connected in parallel at respective first terminals (e.g., at common node 112) and connected to ground at their second terminals. In the case of a three-terminal RSD 114 including a volatile selector and a transistor (and optional capacitor), a first terminal of the volatile selector is selectively connected to inverting input 102A with the second terminal thereof connected to a gate of the transistor. Multiple such three-terminal RSDs 114 can be connected in parallel at their respective volatile selector first terminals.

In various embodiments, any suitable number of RSDs 114 may be used in parallel combination, such as 10,000 to 20,000; 20,000 to 60,000; or the like, or any suitable range of value there between. As each resistive switching device has a small capacitance, by coupling a large number of devices in parallel, the small capacitance adds up to a larger RSD capacitance, illustrated as $C_{RSD}$.

In operation, the voltage source provides a voltage, Vref, that is lower than a programming voltage (or lower than a range of programming voltages) of the RSD(s) 114. In this way, the voltage applied to the two-terminal memory devices should not affect the program state of the resistive switching devices. In some embodiments, the program voltage of a non-volatile two-terminal memory device may be on the order of 1 volt, for example, accordingly, the applied Vref should be less than 1 volt, such as 0.2 volts, 0.4 volts, 0.6 volts, 0.8 volts or the like, or any suitable value or range of values there between. Moreover, Vref is not limited by this example, and other voltages can be utilized that are less than a switching voltage of RSD(s) 114. Thus, Vref can have one value or range of values for a non-volatile two-terminal resistive random access memory (ReRAM) (e.g., 0.2 volts-1.0 volts or any suitable value or range there between), a different value/range of values for a non-volatile phase change, magneto-resistive, conductive bridging or other suitable non-volatile memory, yet another value/range of values for a volatile two-terminal selector device (e.g., 0.1 volts-1.0 volts, or any suitable value or range there between), and still another value/range of values for a non-volatile three-terminal RSD comprising a volatile two-terminal selector device (and optional capacitor) coupled to a gate of a transistor.

In response to application of Vref, circuit 100 will begin to oscillate or "ring" and an output of operational amplifier 104 at output node 106 will oscillate at a detectable frequency. This oscillation is a result of the time delay in rise of the voltage between the non-inverting input 102B and the inverting input 102A, proportional to the R (of resistor 110)*C (of capacitor $C_1$ 116+$C_{RSD}$ 114) of RC circuit 100. When voltage Vref of non-inverting input 102B is above the inverting input 102A, the output of operational amplifier 104 is increased; when the voltage of the inverting input 102A is above that of the Vref at non-inverting input 102B, the output of the op amp is flipped and decreased. The RC circuit 100 provides the delay that facilitates the oscillation of the op amp output at a detectable frequency proportional to the sum of the capacitances: $C_1$ and $C_{RSD}$.

In some embodiments, a voltage source can adjust Vref to different voltages, below a minimum program voltage in a range of suitable program voltages associated with RSDs 114. For instance, where the range of programming voltages for RSDs 114 is between about 1.2 volts and about 1.5 volts, Vref can be set to different voltages at least below 1.2 volts or lower. Different values of Vref can cause operational amplifier 104 to oscillate at different frequencies, in some embodiments. In other embodiments, with different applied Vref voltages, operational amplifier 104 can oscillate about the same oscillation frequencies.

In yet other embodiments, a frequency divider 107 is provided. Divider 107 can be a counter circuit in at least one example, though the subject disclosure is not limited by this particular example. Divider 7 can be configured to reduce an output of operational amplifier 104 to a smaller frequency. In some embodiments, divider 7 can be configured (e.g., pre-fabricated) for a fixed frequency reduction factor (e.g., 20×, 50×, 100×, 1000× reduction, etc.) or can be programmed (e.g., post fabrication) to one of a set of programmable frequency reduction values. Thus, divider 7 could be configured to provide a reduced frequency at divider output 108 that is in MHz, in response to an original output by operational amplifier 104 at output 106 that is in GHz, as one example. As another example, divider 7 can receive a signal at output 106 in MHz frequency and output a signal at output 108 in KHz frequency, or the like.

Based upon a measured or otherwise determined oscillation frequency, trim values of a memory array can be adjusted for suitable operation. Such trim values can pertain to program, read or erase: voltages, currents, cycle period, cycle steps, voltage or current ramp value or ramp/increase rate(s), or the like, or suitable combinations of the foregoing. For example, program, read and erase cycles can include the application of one or more voltage pulses having different magnitudes, different pulse widths, different pulse-to-pulse relationship (e.g., ramp up, ramp down, ramp up rate, ramp down rate, etc.), different overall timing for the cycles, different current limits and so forth. One, a plurality, or all of these parameters can be modified by the trim values mentioned above, in at least some disclosed embodiments. As a non-limiting illustrative example, in response to a low relative oscillation frequency a higher $C_{RSD}$ can be inferred, indicating a relatively thick memory layer. A trim value associated with programming time for RSD(s) 114 can therefore be increased to compensate for the thicker memory layer. The reverse can be true for a high relative oscillation frequency, indicating a relatively thin memory layer.

Trim values and circuitry for adjusting the trim values are typically incorporated in (non-volatile, volatile, etc.) memories on-board the die. In some embodiments, the die incorporating embodiments of the present disclosure can be placed on a testing device, or the like, and an oscillation frequency determined from the testing device. The testing device may then be utilized to program the trim values via registers embedded within the die. In other embodiments, the die may include additional circuitry (not depicted) that can automatically determine suitable trim values based on measured oscillation frequency at output 108 and programmed capacitance value(s) associated with the measured oscillation frequency. Correlation between measured oscillation frequency and capacitance value(s) of $C_{RSD}$ can be stored in memory (not depicted, but see FIGS. 12 and 13, infra) as a lookup table, a database, or other suitable data management structure.

In various embodiments, relationships between oscillation frequency at output 108 and thickness of memory layer, and suitable trim value(s) can be determined at least in part on experimental data. These relationships can then be stored on die, in some embodiments, or on a testing device in other embodiments, and accessed in response to determining the oscillation frequency. These relationships can then be utilized to set trim values of RSD(s) 114 at production, e.g., in the fab or test facility.

In other embodiments, circuit 100 can be replicated in a subset of dies on a semiconductor wafer. In such embodiments, oscillation frequencies for RSDs in one die on the wafer, e.g., at a 12 o'clock position die on the wafer, can be compared to oscillation frequencies determined for other dies on the wafer, e.g., at a 6 o'clock, 3 o'clock, 9 o'clock, etc., position die on the wafer. If the oscillation frequencies are substantially similar, this may indicate a uniform memory layer thickness across the wafer. In contrast, if the oscillation frequencies are different, this may indicate a non-uniform memory layer thickness across the wafer. In some cases, the non-uniformity can be compensated for by setting of trim values on dies determined to have memory layer thicknesses outside of a target value or range of values, to achieve a target RSD performance. However, in other cases, the difference may be outside an acceptable correction range, and such dies can be identified as defective. A large difference in memory layer thickness can be utilized to indicate a problem with fabrication process (e.g., non-uniform deposition of material), and therefore can be utilized to diagnose and a need for process corrections to be made.

Figure 2:
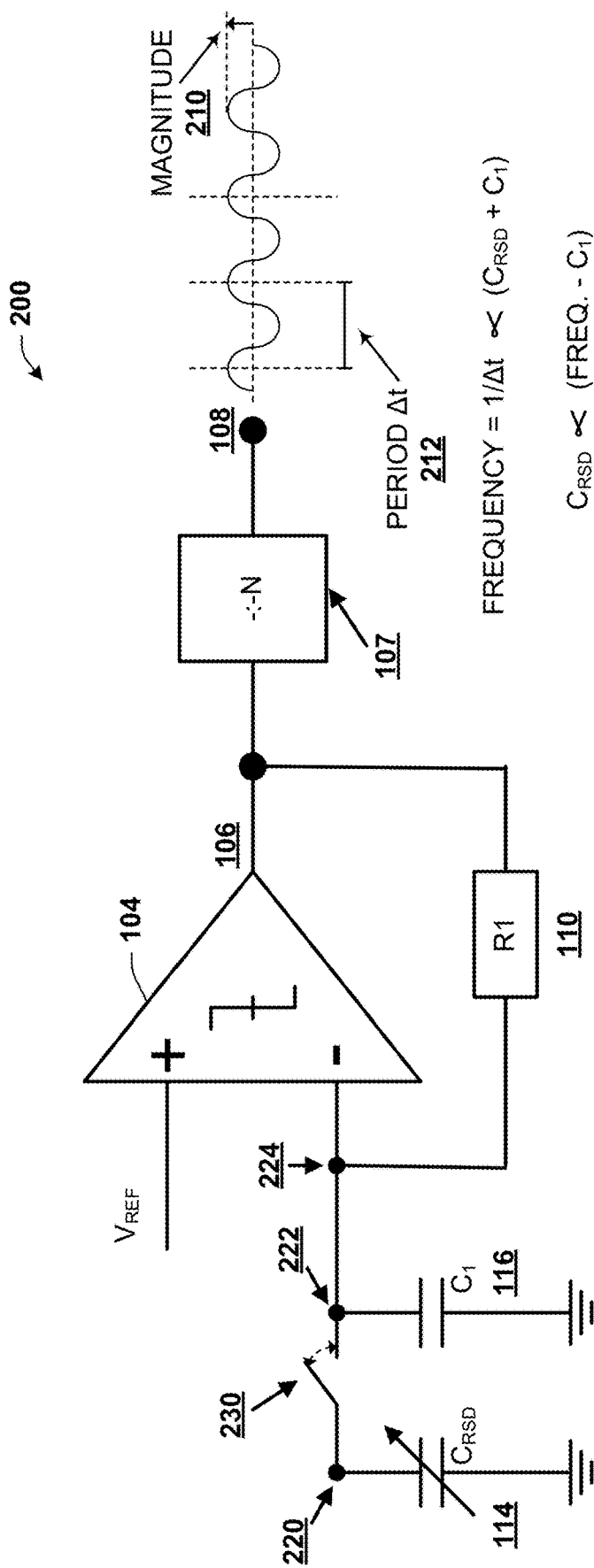
FIG. 2 illustrates a schematic diagram of a sample circuit for providing a frequency output proportional to a capacitance of a switching device(s) coupled to the circuit.

FIG. 2 illustrates an embodiment of a RC circuit 100 for determining capacitance of one or more resistive switching devices within a die of a semiconductor device, in further embodiments. RC circuit 200 can comprise an operational amplifier 104 having inverting and non-inverting inputs (e.g., as described at FIG. 1, supra) and an output 106. Output 106 can be input to an optional divider circuit 107, though divider circuit 107 is not necessary in all embodiments. A resistor 110 is coupled between output 106 of operational amplifier 104 and a common node 224 connected to the inverting input of operational amplifier 104. Moreover, a capacitance can be connected to a second common node 222 and to ground, as illustrated. In an embodiment, second common node 222 and common node 224 can be the same electrical node. One or more RSDs can be selectively connected by way of a switching circuit 230 to second common node 222, common node 224, or both. Switching circuit 230 can be embodied by a switch, a multiplexer, or other suitable mechanism for selectively connecting a first plurality of RSDs 114 with a node (e.g., common node 224, second common node 222, . . . ), selectively disconnecting the first plurality of RSDs 114 from the node, and selectively connecting or disconnecting a second plurality of RSDs (not depicted) with/from the node.

While FIG. 2 illustrates a single capacitance $C_{RSD}$ as coupled to a third common node 220, the capacitance $C_{RSD}$ can be a sum of the (first) plurality of RSDs 114 connected in parallel, as is known by one of ordinary skill in the art. It should be understood that a value of the capacitance $C_{RSD}$ can vary as different pluralities of RSDs (not depicted) are connected to third common node 220, comprising different RSDs, different numbers of RSDs, or the like. Moreover, the connection to third common node 220 can be fixed within a memory array upon fabrication in some embodiments (e.g., the first plurality of RSDs can all be coupled to a common bitline, wordline, sourceline or the like upon fabrication). In alternative embodiments, however, the (first) plurality of RSDs 114 connected to third common node 220 can be selectively provided by a multiplexer or other switching circuit configured to selectively connect various subsets of RSDs of the memory array to third common node 220 instead. Other embodiments not specifically illustrated or described herein but known to one of ordinary skill in the art or reasonably conveyed to one of ordinary skill by way of the context provided herein are considered within the scope of the present disclosure.

In response to a voltage Vref applied at the non-inverting input of operational amplifier 104 of RC circuit 104, an output is generated at output node 108. The output oscillates with a magnitude 210 and having a period 212 defining a frequency of the oscillations. Magnitude 210 can be controlled by a voltage value of Vref. Because the output (e.g., output 106) is provided at node 224 by resistor 110, Vref is selected to maintain magnitude 210 at a voltage smaller than a program voltage (or smaller than a minimum program voltage in a range of program voltages) associated with the plurality of RSDs 114. This prevents bit disturb for memory devices associated with the plurality of RSDs 114 (e.g., see FIGS. 3 and 4, infra). In some embodiments, Vref can be selected to measure capacitance of a two-terminal non-volatile memory component of a RSD comprising a two-terminal volatile selector device in electrical series with the two-terminal non-volatile memory component (e.g., see FIG. 5, infra). In such embodiments, Vref can be selected to have a magnitude large enough to activate the selector device component of the (plurality of) RSDs 114, but small enough to prevent program or erase of the two-terminal non-volatile memory component of the (plurality of) RSDs 114.

As shown in FIG. 2, a frequency of the output generated at output node 108 is equal to 1/period 212 and is proportional to ($C_{RSD}+C_1$). $C_{RSD}$ is therefore proportional to the frequency of the output $-C_1$. $C_{RSD}$ can be determined therefore by measuring the frequency and subtracting the (known) capacitance value of $C_1$. Where a single RSD 114 is coupled to third common node 220, $C_{RSD}$ is the capacitance value of the single RSD 114. Where a plurality of RSDs 114 are coupled to third common node 220, $C_{RSD}$ represents a sum of the capacitances of the plurality of RSDs 114. By dividing by the number of RSDs in the plurality of RSDs 114, an average capacitance per RSD can be determined.

Figure 3:
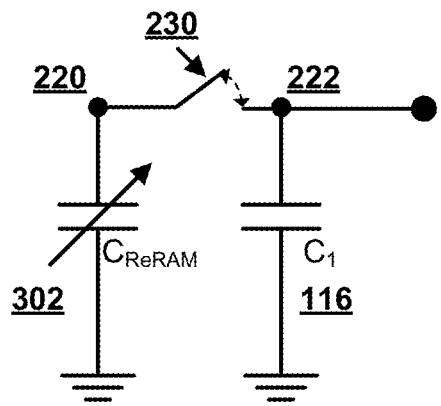
FIG. 3 depicts a disclosed embodiment for determining capacitance of a non-volatile RSD(s)
Figure 3:
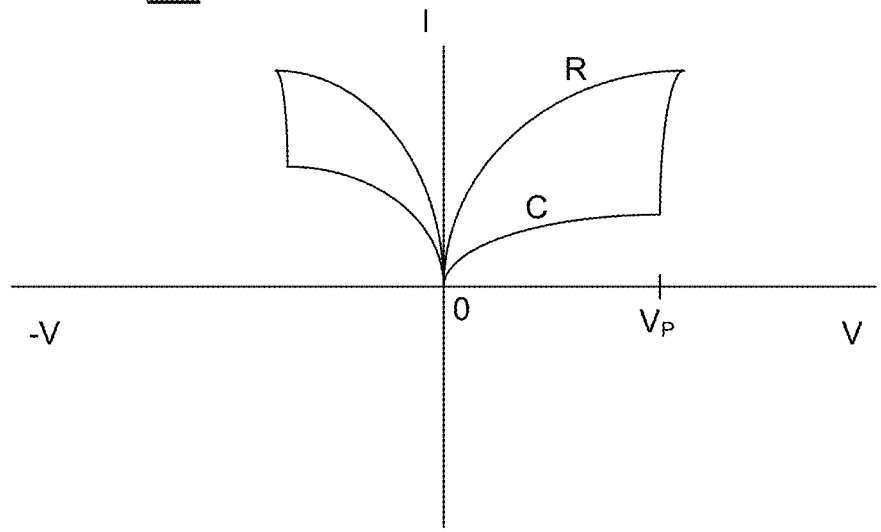

FIG. 3 illustrates a diagram of an example circuit 300 comprising parallel capacitances, in further disclosed embodiments. The parallel capacitances include a fixed capacitor 116 with known capacitance $C_1$, electrically in parallel with one or more two-terminal non-volatile RSD(s) 302. The one or more two-terminal non-volatile RSD(s) 302 can include a single RSD having a first terminal connected to a node 220 and a second terminal connected to ground. Alternatively, two-terminal non-volatile RSD(s) 302 can include a plurality of two-terminal non-volatile resistive switching memory devices having respective first terminals connected in parallel at common node 220, and second terminals connected to ground. A switching device 230 can electrically couple the first terminal(s) to node 222 in parallel with capacitor $C_1$ 116.

The current voltage response 320 of two-terminal non-volatile RSD(s) 302 is illustrated as well (though not necessarily to scale). To measure capacitance of two-terminal non-volatile RSD(s) 302, the devices should be in an erased (high resistance) state. To prevent the RSD(s) 302 from programming to a low resistance state, voltage across the RSD(s) 302 should be maintained at a magnitude less than a program voltage magnitude (or less than a minimum program voltage magnitude (e.g., <1.2 volts) of a range of possible program voltage magnitudes (e.g., 1.2 to 1.7 volts)) associated with the RSD(s) 302. $V_P$ illustrates an example program voltage magnitude associated with changing the RSD(s) 302 from the high resistance state (modeling a capacitance) to a low resistance state (modeling a resistance). By maintaining the voltage across RSD(s) 302 below $V_P$, for example, (average) capacitance of RSD(s) 302 can be determined as described herein.

Figure 4:
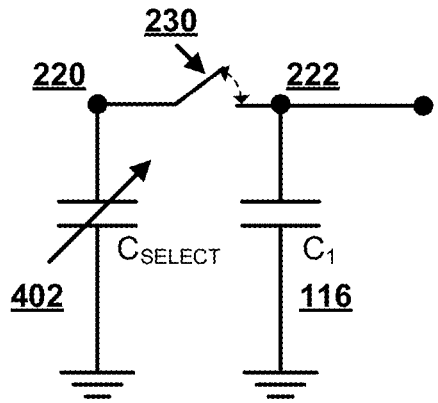
FIG. 4 illustrates a disclosed embodiment for determining capacitance of a volatile RSD(s)
Figure 4:
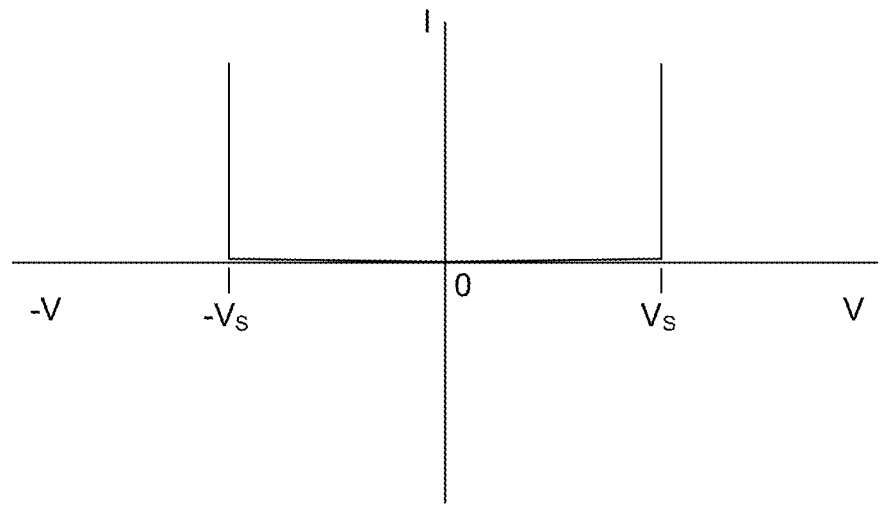

FIG. 4 illustrates a diagram of an example circuit 400 comprising parallel capacitances, in still other disclosed embodiments. The parallel capacitances include a fixed capacitor 116 with known capacitance Ci, electrically in parallel with one or more two-terminal volatile RSD(s) 402. The one or more two-terminal volatile RSD(s) 402 can be two-terminal volatile selector devices, in an embodiment. In some embodiments, RSD(s) 402 can be a single RSD having a first terminal connected to a node 220 and a second terminal connected to ground. Alternatively, RSD(s) 402 can include a plurality of two-terminal volatile RSDs having respective first terminals connected in parallel at common node 220, and second terminals connected to ground. A switching device 230 can electrically couple the first terminal(s) to node 222 in parallel with capacitor $C_1$ 116.

The current voltage response 420 of two-terminal volatile RSD(s) 402 is illustrated. The depicted current-voltage response 420 corresponds (though not necessarily to scale) to a FAST® selector device under development by the assignee of the present application for patent. To measure capacitance of two-terminal volatile RSD(s) 402, the devices should be in a non-activated (high resistance) state, corresponding to a voltage value between a positive switching voltage: $V_S$ and negative switching voltage: $-V_S$ as illustrated. Starting from 0 volts and increasing the applied voltage to a magnitude less than $V_S$ (or $-V_S$) prevents the volatile RSD(s) 402 from switching to a low resistance state. As an example, the voltage across the RSD(s) 302 should be maintained at a magnitude less than a switching voltage magnitude (e.g., <~1.0 volts) or less than a minimum switching voltage magnitude (e.g., <0.8 volts) of a range of possible switching voltage magnitudes (e.g., 0.8 to 1.2 volts) associated with the volatile RSD(s) 402. By maintaining the voltage across volatile RSD(s) 402 between $-V_S$ and $V_S$, for example, (average) capacitance of RSD(s) 402 can be determined as described herein.

Figure 5:
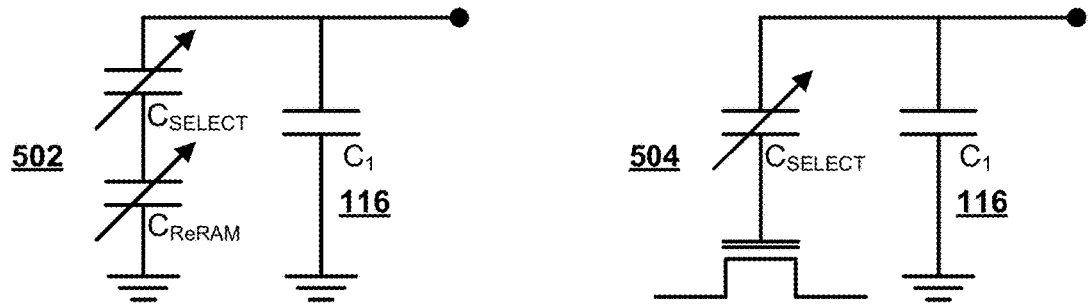
FIG. 5 depicts an embodiment for determining capacitance of a memory cell(s) having a volatile RSD in series with a non-volatile RSD.
Figure 5:
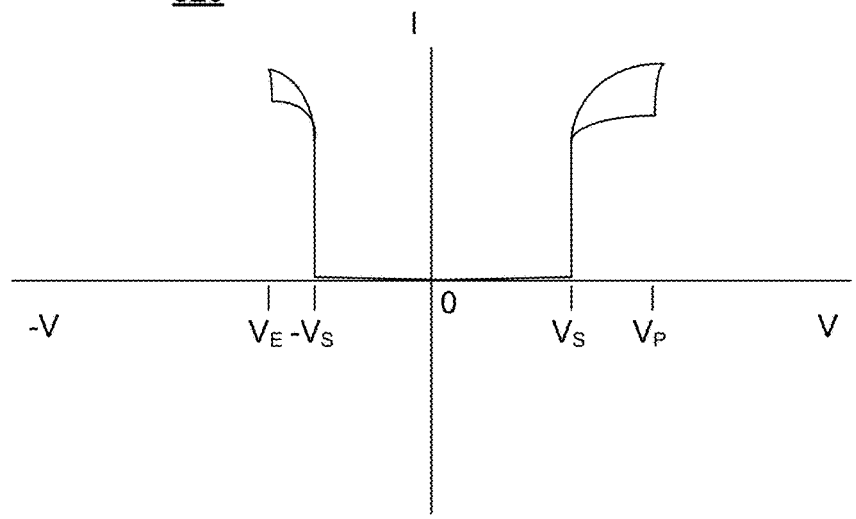

FIG. 5 illustrates a diagram of an example circuit 500 comprising parallel capacitances, in still other disclosed embodiments. The parallel capacitances include a fixed capacitor 116 with known capacitance $C_1$, electrically in parallel with one or more memory cells 502, 504. A first memory cell 502 can comprise a two-terminal memory cell 502 that includes a two-terminal volatile switching device in electrical series with a two-terminal non-volatile memory device. The current-voltage response (though not necessarily to scale) of two-terminal memory cell(s) 502 is provided at 520. In another embodiment, a second memory cell 502 can comprise a three-terminal memory cell 504 that can include a two-terminal volatile switching device connected at one terminal to a gate of a CMOS transistor. In either embodiment, memory cell(s) 502, 504 can be a single two-terminal memory cell 502 having a first terminal connected to a node 220 and a second terminal connected to ground (502) or a single three-terminal memory cell 504 with a two-terminal selector device having a first selector terminal connected to node 220 and a second selector terminal connected to the gate of the CMOS transistor. Alternatively, RSD(s) 502 can include a plurality of memory cells 502, 504 having respective first terminals connected in parallel at common node 220, and second terminals connected to ground or to respective gates of respective CMOS transistors.

For memory cell 502, capacitance of the combined volatile selector and non-volatile memory device of memory cell 502 can be measured, in some embodiments, or capacitance of the two-terminal non-volatile memory device exclusive of the two-terminal volatile selector device can be measured. In the first case, Vref is maintained below a switching voltage magnitude, $V_S$ or $-V_S$, to maintain the selector device in a high resistance state. In this manner, the capacitance of the series combination of the volatile selector device and non-volatile memory device can be measured as described herein. In other embodiments, Vref can be increased above $V_S$ and maintained below a program voltage $V_P$ of the two-terminal non-volatile memory device to measure capacitance of the memory device exclusive of the selector device. For memory cell 504, capacitance of the volatile selector device of memory cell 504 can be measured simply by maintaining Vref below the switching voltage magnitude, $V_S$ or $-V_S$ to maintain the selector device in the high resistance state.

Figure 6:
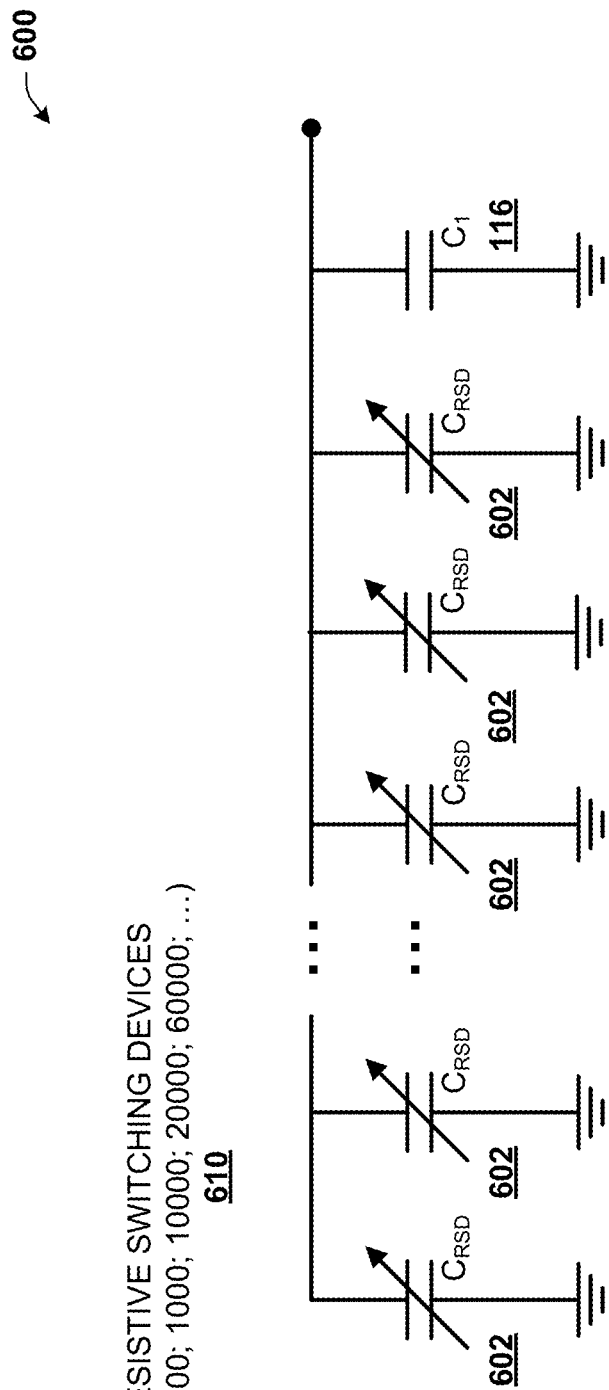
FIG. 6 illustrates an embodiment for determining capacitance of a plurality of RSDs or memory cells composed of volatile and non-volatile RSDs.

FIG. 6 illustrates an embodiment 600 in which a plurality of resistive switching devices 610 are coupled electrically in parallel to measure combined capacitance of the plurality of resistive switching devices 610. As illustrated, individual two-terminal RSDs 602 are connected in parallel to each other and to a capacitance $C_1$ 116. In various embodiments, a number of the resistive switching devices 610 can be about 10, about 100, about 1000, about 10000, about 20000, about 60000 or more; can be in a range of about 10 to about 100, a range of about 100 to about 1000, a range of about 1000 to about 10000, a range of about 10000 to about 20000, a range of about 20000 to about 60000 or larger, or can be any suitable number between those explicitly identified or can be any suitable range of values between those explicitly identified.

Figure 7:
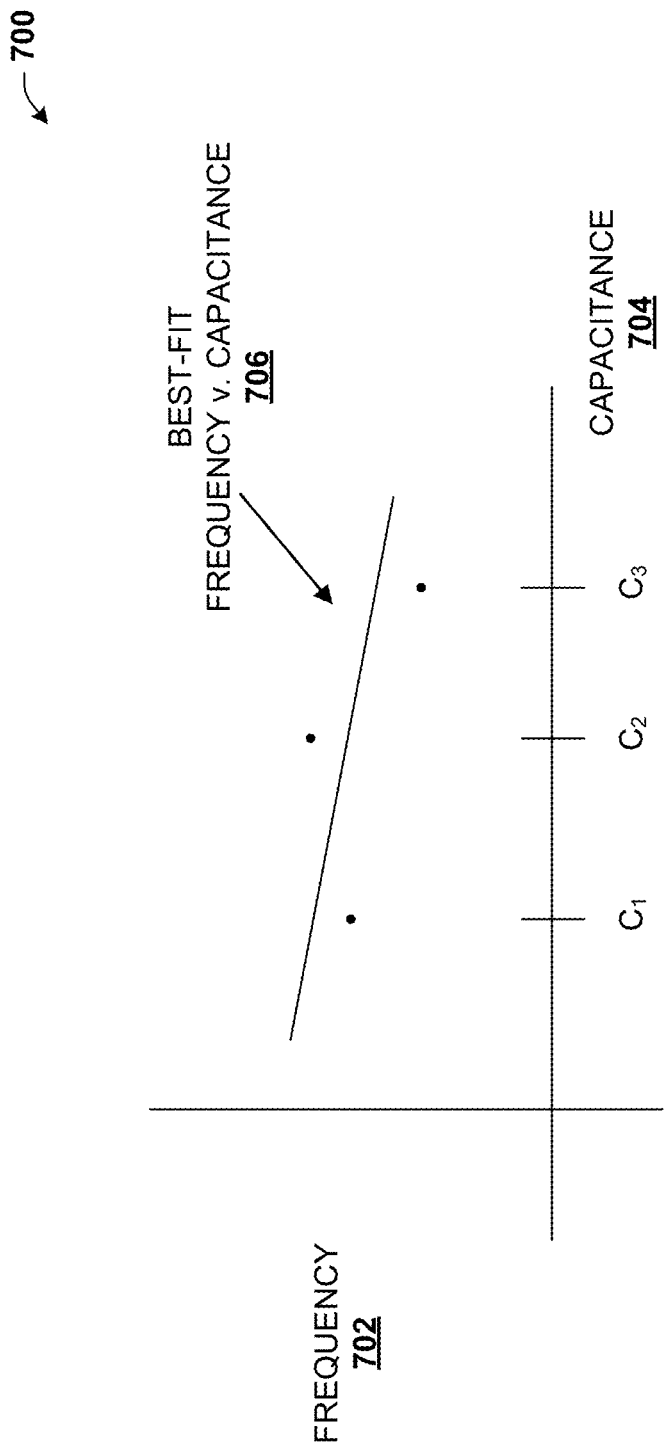
FIG. 7 depicts an embodiment for determining a relationship between frequency of an RC circuit and average capacitance of sets of RSDs coupled to the RC circuit.

FIG. 7 illustrates an alternative embodiment 700 for characterizing capacitance of an array of memory devices. A set of Vref voltages can be applied to a plurality of memory devices, yielding a range of capacitance measurements according to RC measurement circuits described herein. Capacitance 704 versus frequency 702 for such measurements is illustrated at FIG. 7. A best-fit frequency v. capacitance relationship 706 can be plotted to characterize the memory devices of the array.

The diagrams included herein are described with respect to interaction between several memory devices, memory device components, memory arrays or electronic circuit. It should be appreciated that such diagrams can include those memory devices, components, arrays and circuits specified therein, some of the specified memory devices/components/arrays/circuits, or suitable alternative or additional memory devices/components/arrays/circuits. Sub-components of a circuit or memory device can also be implemented as electrically connected to other sub-components rather than included within a parent circuit, where suitable. Likewise, individual components can be implemented in a combined architecture according to other embodiments. Moreover, some of the disclosed embodiments can be implemented as part(s) of other disclosed embodiments where suitable.

Still further, one or more disclosed processes can be combined into a single process providing aggregate functionality. For instance, a program or erase process can comprise a read/verify process, or vice versa, to facilitate programming/erasing a memory cell and verifying completion of the programming/erasing by way of a single process.

In addition, it should be appreciated that respective rows of multiple memory device architectures can be erased in groups (e.g., multiple rows erased concurrently) or individually. Moreover, it should be appreciated that multiple memory cells on a particular row can be read or programmed in groups (e.g., multiple memory cells read/programmed concurrently) or individually. Components of the disclosed architectures can also interact with one or more other components not specifically described herein but known by those of skill in the art or made reasonably evident to one of ordinary skill in the art by way of the context provided herein.

Figure 8:
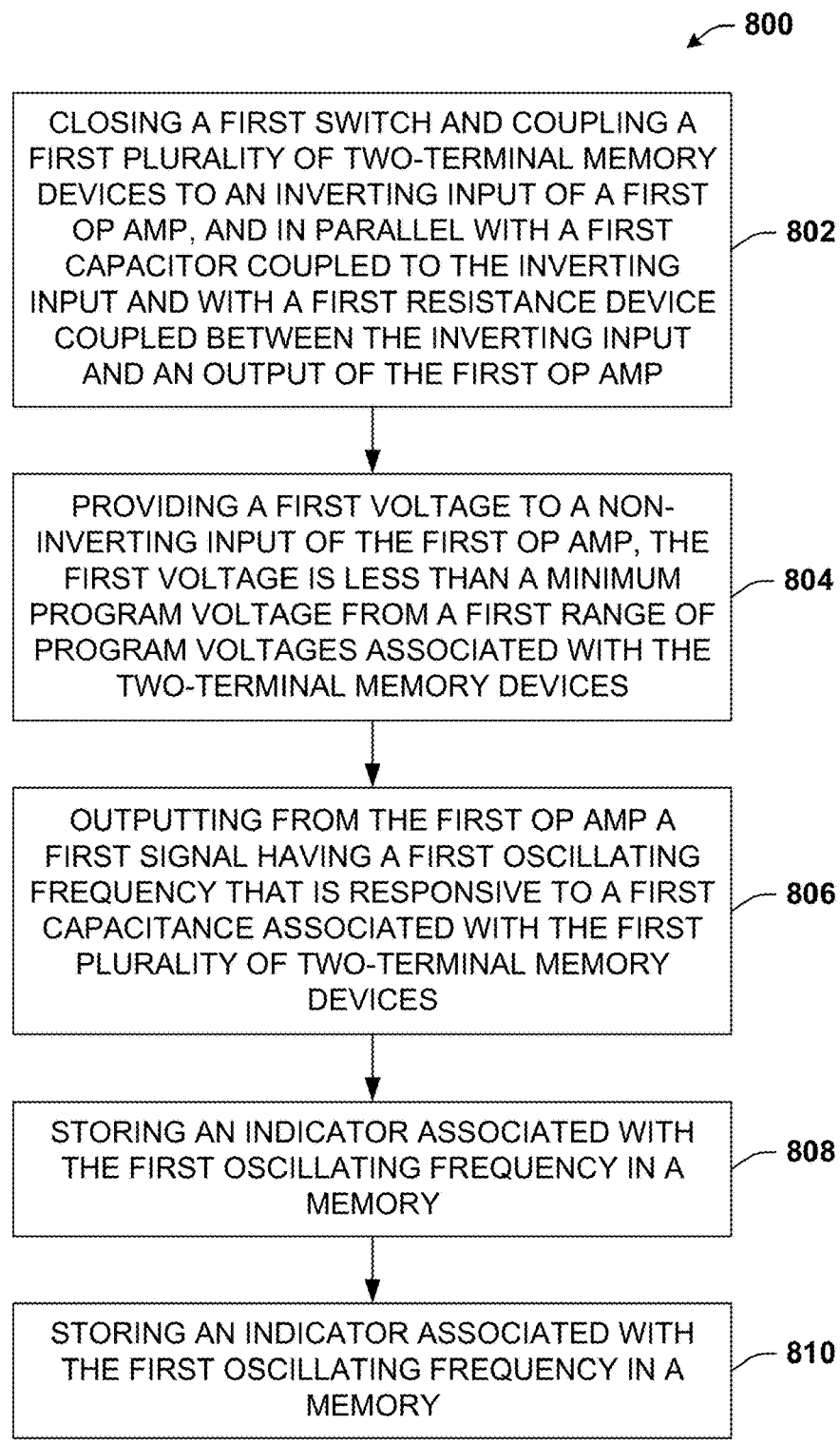
FIG. 8 illustrates a flowchart of an example method for determining a capacitance of a plurality of two-terminal memory devices of a memory array.

Referring now to FIG. 8, there is depicted an example flowchart of a method 800 for characterizing a memory array of a semiconductor die, in additional disclosed embodiments. At 802, method 800 can comprise closing a first switch and coupling a first plurality of two-terminal memory devices to an inverting input of a first operational amplifier, wherein each of the first plurality of two-terminal memory devices is characterized by a program voltage within a first range of program voltages. In an embodiment, a first capacitor can be coupled between the inverting input of the first operational amplifier and ground, and a first resistance device can be coupled between the inverting input of the first operational amplifier and an output of the first operational amplifier. The first capacitor and first resistance device can be electrically in parallel to the first plurality of two-terminal memory devices in response to closing the first switch.

At 804, method 800 can comprise providing with a first voltage source, a first input voltage to a non-inverting input of the first operational amplifier, wherein the first input voltage is less than a minimum program voltage from the first range of voltages. At 806, method 800 can comprise outputting with the first operational amplifier, a first signal, wherein the first signal is characterized by a first oscillating frequency, wherein the first oscillating frequency is responsive to a first capacitance associated with the first plurality of two-terminal memory devices.

At 808, method 800 can comprise measuring a frequency value of the first oscillating frequency. At 810, method 800 can comprise storing in a memory, an indicator associated with the first oscillating frequency measurement.

In an embodiment, the first plurality of two-terminal memory devices, the first switch, the first operational amplifier, the first capacitor, the first resistance device, and the first voltage source are formed within a first die of a plurality of dies formed on a semiconductor device. In another embodiment(s), a second die from the plurality of dies comprises a second plurality of two-terminal memory devices, a second switch, a second operational amplifier, a second capacitor, a second resistance device and a second voltage source. In such embodiment(s), method 800 can further comprise closing the second switch and coupling the second plurality of two-terminal memory devices to an inverting input of the second operational amplifier, wherein each of the second plurality of two-terminal memory devices is characterized by a second program voltage within a second range of program voltages. Furthermore, the second capacitor can be coupled between the inverting input of the second operational amplifier and ground, and the second resistance device can be coupled between the inverting input of the second operational amplifier and an output of the second operational amplifier in various embodiments. In further embodiments, method 800 can comprise providing with the second voltage source, a second input voltage to a non-inverting input of the second operational amplifier, wherein the second input voltage is less than a minimum program voltage from the second range of program voltages. Moreover, method 800 can comprise outputting with the second operational amplifier, a second signal, wherein the second signal is characterized by a second oscillating frequency, wherein the second oscillating frequency is responsive to a second capacitance associated with the second plurality of two-terminal memory devices. Still further, method 800 can comprise measuring a second frequency value of the second oscillating frequency and storing in a second memory, a second indicator associated with the second oscillating frequency. In a further embodiment, method 800 can comprise determining a pass condition for the semiconductor wafer when a difference between the frequency value of the first oscillating frequency and the second oscillating frequency value of the second oscillating frequency is within a predetermined range of frequencies.

In alternative or additional embodiments, method 800 can comprise providing with the first voltage source, a second input voltage to the non-inverting input of the first operational amplifier, wherein the second input voltage is less than the minimum program voltage from the first range of program voltages. Further, method 800 can comprise outputting with the first operational amplifier, a second signal, wherein the second signal is characterized by a second oscillating frequency, wherein the second oscillating frequency is responsive to the first capacitance associated with the first plurality of two-terminal memory devices. In various embodiments, method 800 can also comprise measuring a second frequency value of the second oscillating frequency and storing in the memory, a second indicator associated with the second oscillating frequency.

In an embodiment(s), method 800 can also comprise determining a pass condition for the first plurality of two-terminal memory devices when a difference between the first oscillating frequency and the second oscillating frequency is within a predetermined range of frequencies. As an example, the difference between the first input voltage and the second input voltage can be less than 0.5 volts.

According to still other embodiments, method 800 can comprise modifying a trim value in response to the indicator associated with the first oscillating frequency and storing the trim value in the memory. In at least one such embodiment, the trim value can be associated with a parameter associated with the first plurality of two-terminal memory devices, wherein the parameter is selected from a group consisting of: a read parameter, a write parameter, and an erase parameter. In at least on embodiment, a number of two-terminal memory devices in the first plurality of two-terminal memory devices is within a range of 20,000 to 60,000. In other embodiments, outputting with the first operational amplifier, the first signal, can additionally comprise outputting with the first operational amplifier a second signal, wherein the second signal is characterized by a second oscillating frequency and dividing the second oscillating frequency with a frequency divider to determine the first oscillating frequency.

Figure 9:
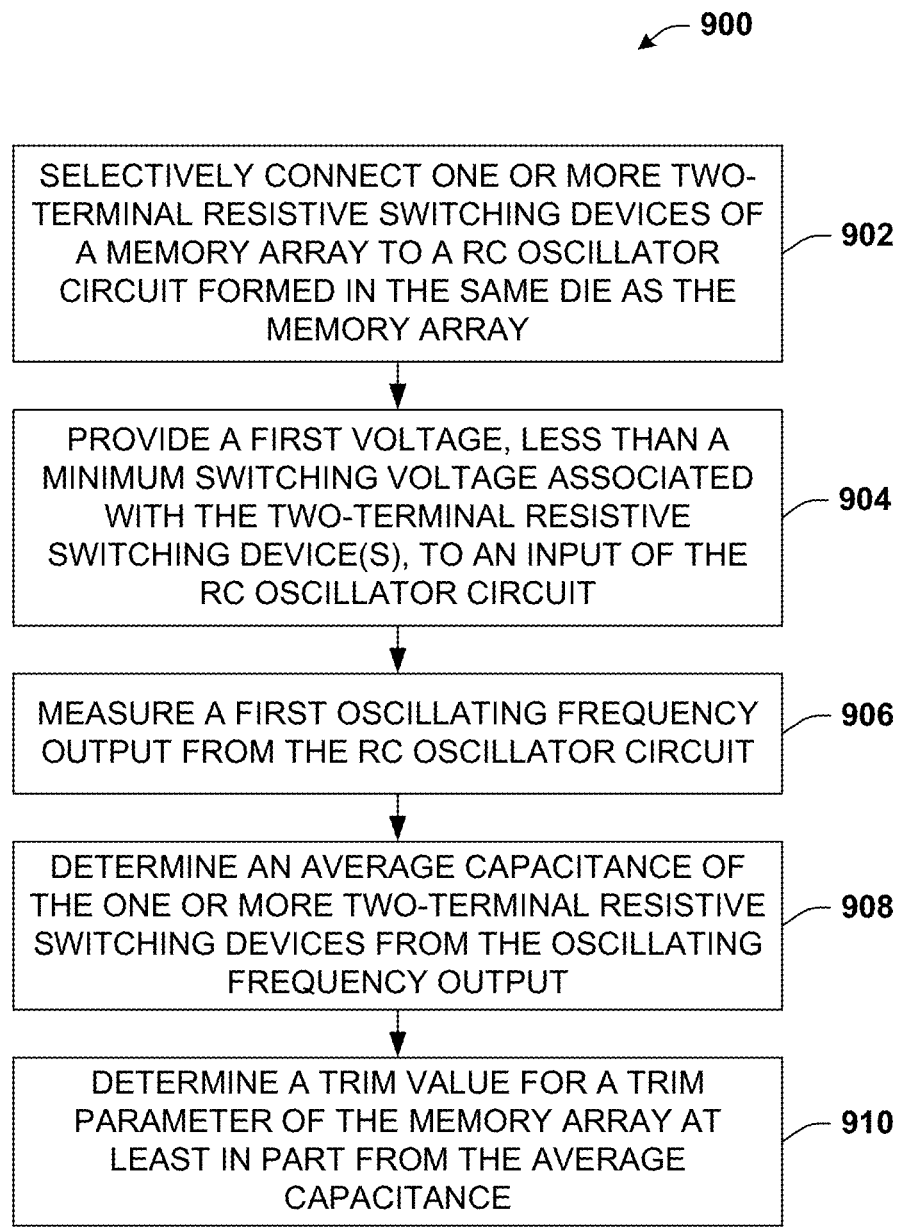
FIG. 9 depicts a flowchart of a sample method for adjusting trim values of a memory array utilizing on-die capacitance determinations of memory devices of the array.

Referring now to FIG. 9, there is depicted a method 900 for characterizing resistive switching devices of a memory array, in various embodiments. At 902, method 900 can comprise selectively connecting one or more two-terminal resistive switching devices of a memory array to a RC oscillator circuit formed in the same die as the memory array. At 904, method 900 can comprise providing a first voltage, less than a minimum switching voltage associated with the two-terminal resistive switching device(s), to an input of the RC oscillator circuit. Moreover, at 906, method 900 can comprise measuring a first oscillating frequency output from the RC oscillator circuit and, at 908, method 900 can comprise determining an average capacitance of the one or more two-terminal resistive switching devices from the oscillating frequency output. At 910, method 900 can comprise determining a trim value for a trim parameter of the memory array at least in part from the average capacitance.

Figure 10:
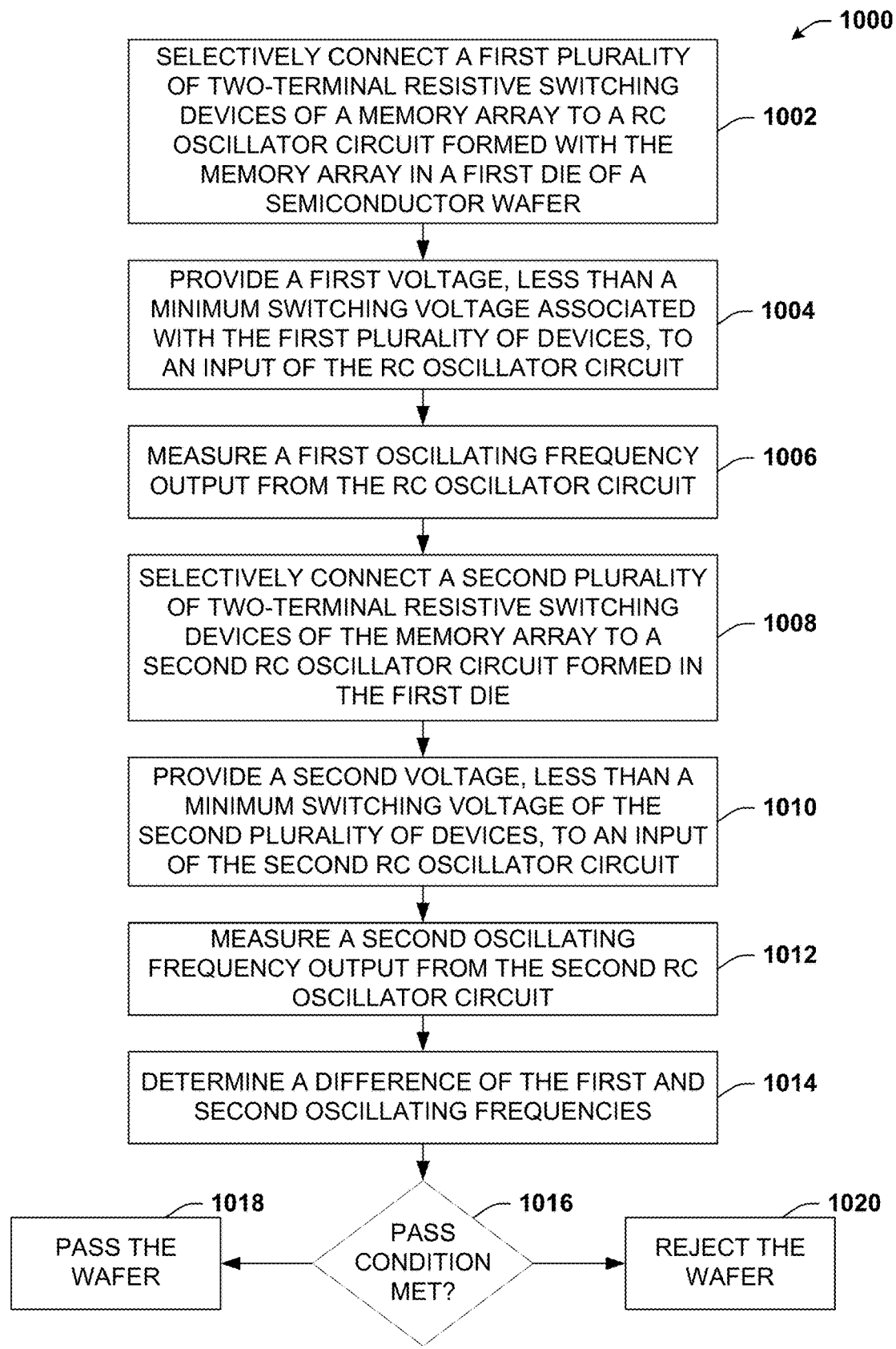
FIG. 10 depicts a flowchart of an example method for determining memory layer uniformity across multiple dies of a wafer in some disclosed embodiments.

FIG. 10 depicts a method 1000 for measuring characteristics of a memory device according to alternative or additional embodiments of the present disclosure. At 1002, method 1000 can comprise selectively connecting a first plurality of two-terminal resistive switching devices of a memory array to a RC oscillator circuit formed with the memory array in a first die of a semiconductor wafer. At 1004, method 1000 can comprise providing a first voltage, less than a minimum switching voltage associated with the first plurality of devices, to an input of the RC oscillator circuit. In addition to the foregoing, at 1006, method 1000 can comprise measuring a first oscillating frequency output from the RC oscillator circuit.

At 1008, method 1000 can comprise selectively connecting a second plurality of two-terminal resistive switching devices of the memory array to a second RC oscillator circuit formed in the first die. Additionally, at 1010, method 1000 can comprise providing a second voltage, less than a minimum switching voltage of the second plurality of devices, to an input of the second RC oscillator circuit. At 1012, method 1000 can comprise measuring a second oscillating frequency output from the second RC oscillator circuit, and at 1014 method 1000 can comprise determining a difference of the first and second oscillating frequencies. Still further, at 1016, method 1000 can comprise determining whether a pass condition is met. The pass condition can be a difference between the first and second oscillating frequencies being smaller than a target value (or range of values), in an embodiment. The target value can be set based on characteristics of the first and second plurality of devices, characteristics of the first die and second die, characteristics of the semiconductor wafer, or the like, or a suitable combination of the foregoing. In response to the pass condition being met, method 1000 can proceed to 1018 and pass the wafer. In response to the pass condition failing, method 1000 proceeds to 1020 and the wafer is rejected.

Figure 11:
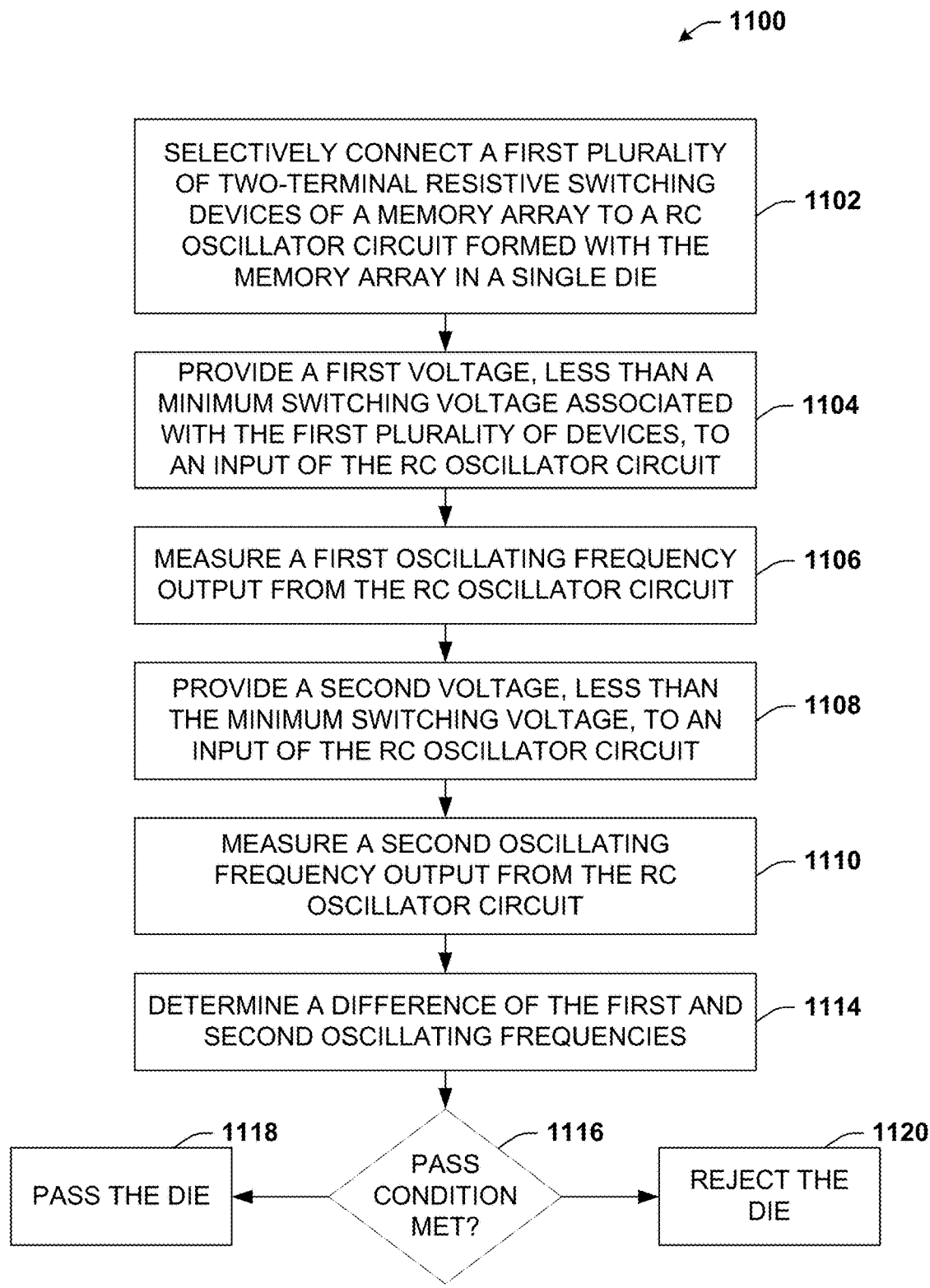
FIG. 11 illustrates a flowchart of a sample method for determining a range of memory layer characteristics across single die, in further embodiments.

FIG. 11 illustrates a flowchart of an example method 1100 according to alternative or additional embodiments of the present disclosure. At 1102, method 1100 can comprise selectively connecting a first plurality of two-terminal resistive switching devices of a memory array to a RC oscillator circuit formed with the memory array in a single die of a semiconductor device. At 1104, method 1100 can comprise providing a first voltage, less than a minimum switching voltage associated with the first plurality of devices, to an input of the RC oscillator circuit. At 1106, method 1100 can comprise measuring a first oscillating frequency output from the RC oscillator circuit, and at 1108, method 1100 can comprise providing a second voltage, less than the minimum switching voltage, to an input of the RC oscillator circuit.

At 1110, method 1100 can comprise measuring a second oscillating frequency output from the RC oscillator circuit. Moreover, at 1114, method 1100 can comprise determining a difference of the first and second oscillating frequency. At 1116, method 1100 can comprise determining whether a pass condition for the die has been met. In an embodiment, the pass condition can be whether a difference of the first and second oscillating frequencies is less than a target value. In response to the pass condition being met, method 1100 can proceed to 1118 and the die can be passed. In response to the pass condition failing, method 1100 can proceed to 1120 and the die can be rejected.

Example Operating Environments

Figure 12:
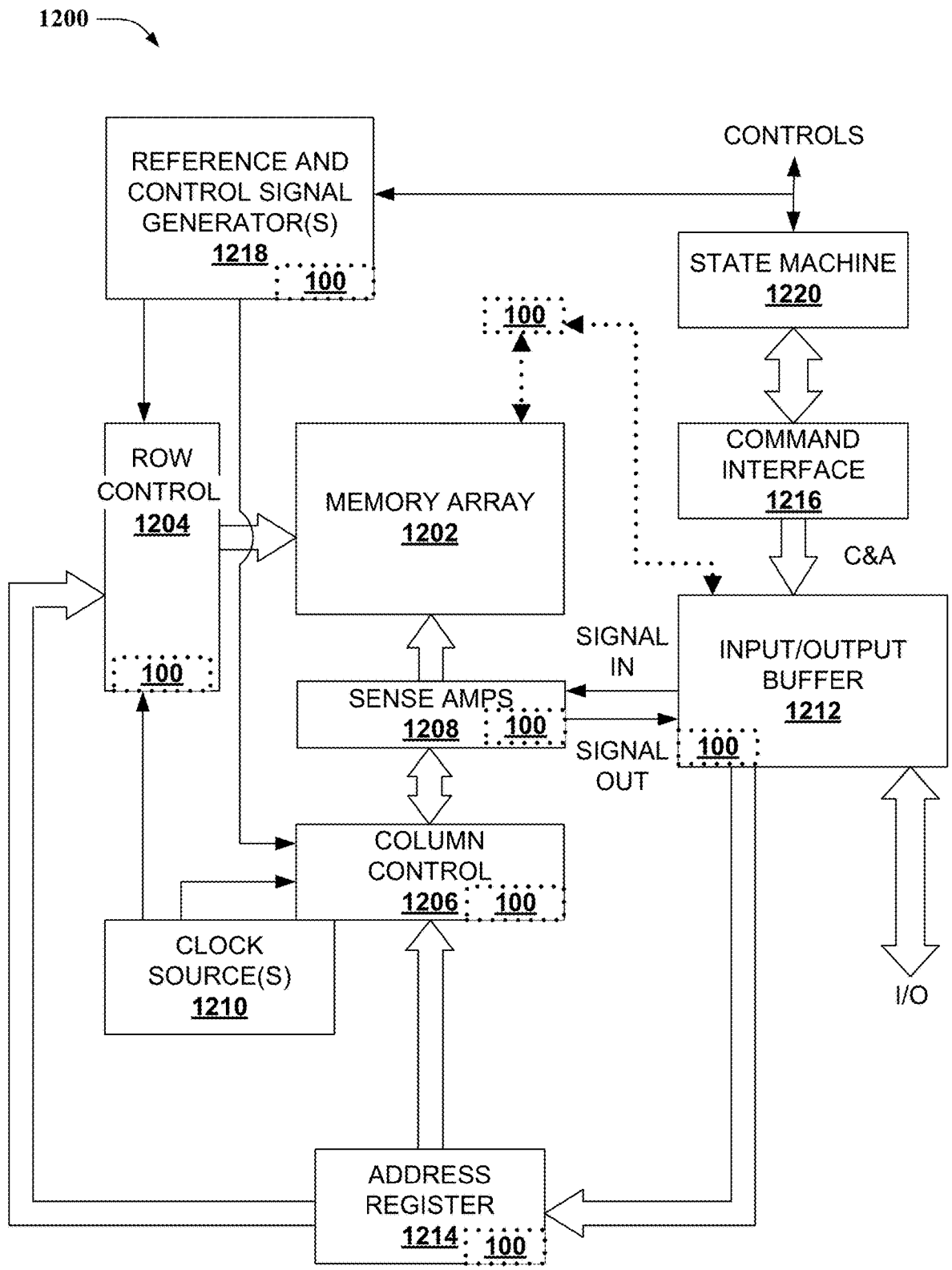
FIG. 12 depicts a block diagram of an example electronic operating environment in accordance with certain embodiments of the present disclosure.

In order to provide a context for the various aspects of the disclosed subject matter, FIG. 12, as well as the following discussion, is intended to provide a brief, general description of a suitable environment in which various aspects of the disclosed subject matter can be implemented or processed. While the subject matter has been described above in the general context of semiconductor architectures and process methodologies for fabricating, operating or characterizing arrays of two-terminal memory devices, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects can also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory (e.g. CF card, USB memory stick, SD card, microSD card), or the like. In a distributed computing environment, program modules can be located in both local and remote memory storage modules or devices.

FIG. 12 illustrates a block diagram of an example operating and control environment 1200 for a memory array 1202 of a multi-block memory cell array according to aspects of the subject disclosure. In at least one aspect of the subject disclosure, memory array 1202 can comprise memory selected from a variety of memory cell technologies. In at least one embodiment, memory array 1202 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing. In yet another embodiment, memory array 1202 can be configured to be characterized for thickness(es) of a memory layer(s) in which memory array 1202 is formed, as described herein.

A column controller 1206 and sense amps 1208 can be formed adjacent to memory array 1202. Moreover, column controller 1206 can be configured to activate (or identify for activation) a subset of bitlines of memory array 1202. Column controller 1206 can utilize a control signal provided by a reference and control signal generator(s) 1218 to activate, as well as operate upon, respective ones of the subset of bitlines, applying suitable program, erase or read voltages to those bitlines. Non-activated bitlines can be kept at an inhibit voltage (also applied by reference and control signal generator(s) 1218), to mitigate or avoid bit-disturb effects on these non-activated bitlines.

In addition, operating and control environment 1200 can comprise a row controller 1204. Row controller 1204 can be formed adjacent to and electrically connected with word lines (and source lines, in some embodiments) of memory array 1202. Further, utilizing control signals of reference and control signal generator(s) 1218, row controller 1204 can select particular rows of memory cells with a suitable selection voltage. Moreover, row controller 1204 can facilitate program, erase or read operations by applying suitable voltages at selected word lines (and source lines). Similar to column controller 1206, row controller 1204 can apply an inhibit voltage to non-activated wordlines (source lines) to mitigate or avoid bit-disturb effects on the non-activated wordlines (source lines).

Sense amps 1208 can read data from, or write data to the activated memory cells of memory array 1202, which are selected by column control 1206 and row control 1204. Data read out from memory array 1202 can be provided to an input and input/output buffer 1212. Likewise, data to be written to memory array 1202 can be received from the input and input/output buffer 1212 and written to the activated memory cells of memory array 1202.

A clock source(s) 1210 can provide respective clock pulses to facilitate timing for read, write, and program operations of row controller 1204 and column controller 1206. Clock source(s) 1210 can further facilitate selection of wordlines or bitlines in response to external or internal commands received by operating and control environment 1200. Input and input/output buffer 1212 can comprise a command and address input, as well as a bidirectional data input and output. Instructions are provided over the command and address input, and the data to be written to memory array 1202 as well as data read from memory array 1202 is conveyed on the bidirectional data input and output, facilitating connection to an external host apparatus, such as a computer or other processing device (not depicted, but see e.g., computer 1302 of FIG. 13, infra).

Input and input/output buffer 1212 can be configured to receive write data, receive an erase instruction, receive a status or maintenance instruction, output readout data, output status information, and receive address data and command data, as well as address data for respective instructions. Address data can be transferred to row controller 1204 and column controller 1206 by an address register 1214. In addition, input data is transmitted to memory array 1202 via signal input lines between sense amps 1208 and input and input/output buffer 1212, and output data is received from memory array 1202 via signal output lines from sense amps 1208 to input and input/output buffer 1212. Input data can be received from the host apparatus, and output data can be delivered to the host apparatus via the I/O bus.

In an embodiment, an RC circuit 100 for determining capacitance of subsets of memory array 1202 is provided. RC circuit 100 is formed on die with operating and control environment 1200. In various embodiments, RC circuit 100 can be fabricated within or among input/output buffer 1212, address register 1214, column control 1206, row control 1204, sense amps 1208 or reference and control signal generator(s) 1218, or other suitable component or a suitable combination of the foregoing. In another embodiments, RC circuit 100 can be fabricated separate from the foregoing components with independent connection to memory array 1202 and to input/output buffer 1212 for receiving and responding to commands, as illustrated.

Commands received from the host apparatus can be provided to a command interface 1216. Command interface 1216 can be configured to receive external control signals from the host apparatus, and determine whether data input to the input and input/output buffer 1212 is write data, a command, or an address. Input commands can be transferred to a state machine 1220.

State machine 1220 can be configured to manage programming and reprogramming of memory array 1202 (as well as other memory banks of the multi-bank memory array). Instructions provided to state machine 1220 are implemented according to control logic configurations, enabling state machine 1220 to manage read, write, erase, data input, data output, and other functionality associated with memory array 1202. In some aspects, state machine 1220 can send and receive acknowledgments and negative acknowledgments regarding successful receipt or execution of various commands. In further embodiments, state machine 1220 can decode and implement status-related commands, decode and implement configuration commands, and so on.

To implement read, write, erase, input, output, etc., functionality, state machine 1220 can control clock source(s) 1210 or reference and control signal generator(s) 1218. Control of clock source(s) 1210 can cause output pulses configured to facilitate row controller 1204 and column controller 1206 implementing the particular functionality. Output pulses can be transferred to selected bitlines by column controller 1206, for instance, or wordlines by row controller 1204, for instance.

Figure 13:
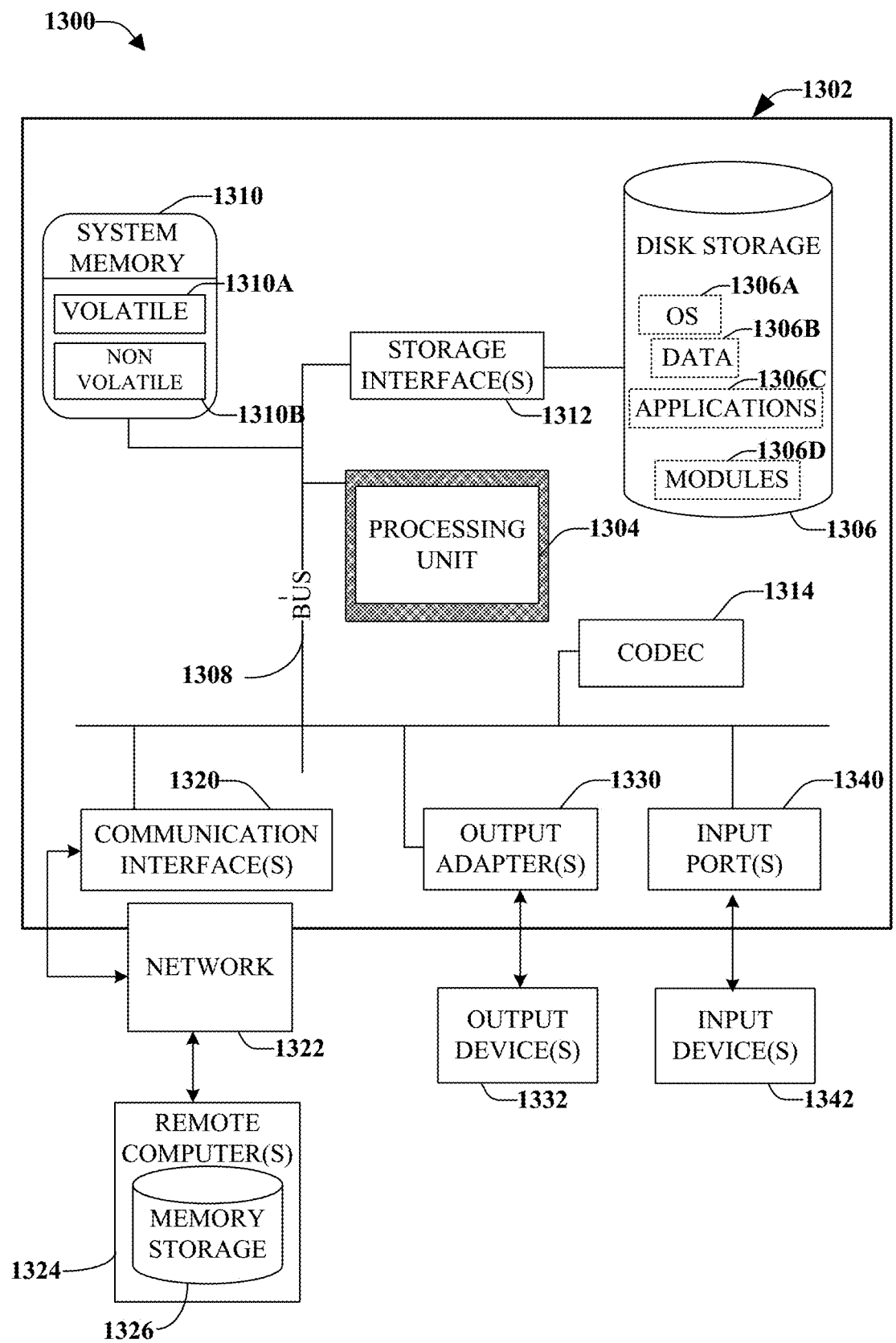
FIG. 13 illustrates a block diagram of a sample computing environment for implementing one or more disclosed embodiments presented herein.

With reference to FIG. 13, a suitable environment 1300 for implementing various aspects of the claimed subject matter includes a computer 1302. The computer 1302 includes a processing unit 1304, a system memory 1310, a codec 1314, and a system bus 1308. The system bus 1308 couples system components including, but not limited to, the system memory 1310 to the processing unit 1304. The processing unit 1304 can be any of various available processors. Dual microprocessors and other multiprocessor architectures also can be employed as the processing unit 1304.

The system bus 1308 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1310 includes volatile memory 1310A and non-volatile memory 1310B. The basic input/output system (BIOS), containing the basic routines to transfer information between elements within the computer 1302, such as during start-up, is stored in non-volatile memory 1310B. In addition, according to present innovations, codec 1314 may include at least one of an encoder or decoder, wherein the at least one of an encoder or decoder may consist of hardware, software, or a combination of hardware and software. Although, codec 1314 is depicted as a separate component, codec 1314 may be contained within non-volatile memory 1310B. By way of illustration, and not limitation, non-volatile memory 1310B can include read only memory (ROM), programmable ROM (PROM), electrically programmable ROM (EPROM), electrically erasable programmable ROM (EEPROM), or flash memory, two-terminal memory, and so on. Volatile memory 1310A includes random access memory (RAM), which acts as external cache memory. According to present aspects, the volatile memory may store the write operation retry logic (not shown in FIG. 13) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 1302 may also include removable/non-removable, volatile/non-volatile computer storage medium. FIG. 13 illustrates, for example, disk storage 1306. Disk storage 1306 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1306 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1306 to the system bus 1308, a removable or non-removable interface is typically used, such as storage interface 1312. It is appreciated that storage devices 1306 can store information related to a user. Such information might be stored at or provided to a server or to an application running on a user device. In one embodiment, the user can be notified (e.g., by way of output device(s) 1332) of the types of information that are stored to disk storage 1306 or transmitted to the server or application. The user can be provided the opportunity to opt-in or opt-out of having such information collected and/or shared with the server or application (e.g., by way of input from input device(s) 1342).

It is to be appreciated that FIG. 13 describes software that acts as an intermediary between users and the basic computer resources described in the suitable operating environment 1300. Such software includes an operating system 1306A. Operating system 1306A, which can be stored on disk storage 1306, acts to control and allocate resources of the computer system 1302. Applications 1306C take advantage of the management of resources by operating system 1306A through program modules 1306D, and program data 1306D, such as the boot/shutdown transaction table and the like, stored either in system memory 1310 or on disk storage 1306. It is to be appreciated that the claimed subject matter can be implemented with various operating systems or combinations of operating systems.

A user enters commands or information into the computer 1302 through input device(s) 1342. Input devices 1342 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1304 through the system bus 1308 via input port(s) 1340. Input port(s) 1340 include, for example, a serial port, a parallel port, a game port, and a universal serial bus (USB). Output device(s) 1332 use some of the same type of ports as input device(s) 1342. Thus, for example, a USB port may be used to provide input to computer 1302 and to output information from computer 1302 to an output device 1332. Output adapter 1330 is provided to illustrate that there are some output devices 1332 like monitors, speakers, and printers, among other output devices 1332, which require special adapters. The output adapters 1330 include, by way of illustration and not limitation, video and sound cards that provide a means of connection between the output device 1332 and the system bus 1308. It should be noted that other devices and/or systems of devices provide both input and output capabilities such as remote computer(s) 1338.

Computer 1302 can operate in a networked environment using logical connections to one or more remote computers, such as remote computer(s) 1324. The remote computer(s) 1324 can be a personal computer, a server, a router, a network PC, a workstation, a microprocessor based appliance, a peer device, a smart phone, a tablet, or other network node, and typically includes many of the elements described relative to computer 1302. For purposes of brevity, only a memory storage device 1326 is illustrated with remote computer(s) 1324. Remote computer(s) 1324 is logically connected to computer 1302 through a network 1322 and then connected via communication interface(s) 1320. Network 1322 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication interface(s) 1320 refers to the hardware/software employed to connect the network 1322 to the bus 1308. While communication interface(s) 1320 is shown for illustrative clarity inside computer 1302, it can also be external to computer 1302. The hardware/software necessary for connection to the network 1322 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising".

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Further embodiments can be envisioned to one of ordinary skill in the art after reading this disclosure. For example, in various embodiments, erase operations may be initiated upon a plurality of ReRAM devices (e.g. 16, 32, etc.) at the same time.

In other embodiments, combinations or sub-combinations of the above disclosed embodiments can be advantageously made. The block diagrams of the architecture and flow charts are grouped for ease of understanding. However, it should be understood that combinations of blocks, additions of new blocks, re-arrangement of blocks, and the like are contemplated in alternative embodiments of the present disclosure.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A semiconductor device, comprising:
a first plurality of two-terminal memory devices, wherein each of the two-terminal memory devices is characterized by a program voltage within a range of program voltages, wherein the first plurality of two-terminal memory devices is associated with a first capacitance, and wherein the first plurality of two-terminal memory devices is selectively coupled in parallel between ground and a first common node;
a first capacitor coupled between ground and a second common node, wherein the first capacitor is characterized by a second capacitance;
a first voltage source configured to provide a first input voltage, wherein the first input voltage is lower than the range of program voltages;
a first operational amplifier including an inverting input, a non-inverting input, and an output, wherein the non-inverting input is coupled to the first voltage source, wherein the inverting input is coupled to a third common node, and wherein the output is coupled to a fourth common node; and
a first resistance device coupled between the third common node and the fourth common node, wherein the first common node is coupled to the second common node and the third common node.

2. The device of claim 1, wherein a capacitance value associated with the second capacitance of the first capacitor is larger than a capacitance value associated with the first capacitance of the first plurality of two-terminal memory devices.

3. The device of claim 1, further comprising an inverter having an input and an output, wherein the input of the inverter is coupled to the fourth common node.

4. The device of claim 1, further comprising at least one of:
- a first switch disposed between the first common node and the third common node, wherein the first switch is configured to couple and decouple the first common node from the third common node; or
- a first multiplexer for selectively coupling and decoupling respective first terminals of the first plurality of two-terminal memory devices to the first common node.

5. The device of claim 1, wherein the first voltage source is also configured to provide a second input voltage to the non-inverting input, wherein the second input voltage is lower than the range of program voltages.

6. The device of claim 5, wherein a number of two-terminal memory devices in the first plurality of two-terminal memory devices is within a range of 20,000 to 60,000.

7. The device of claim 1, wherein a two-terminal memory device from the first plurality of two-terminal memory devices is selected from a group consisting of: a filamentary memory device, a non-volatile filamentary resistive switching device, a volatile filamentary resistive switching device, a non-volatile memory consisting of: a transistor, an optional capacitor and a two-terminal resistive selector coupled at a first selector terminal to a gate of the transistor and at a second selector terminal to the optional capacitor, a magneto resistive memory device, a phase change memory device, a carbon nanotube memory device, a conductive bridging memory device, a silicon sub-oxide memory device, and a metal oxide memory device.

8. The device of claim 1, further comprising:
- a second plurality of two-terminal memory devices, wherein each of the second plurality of two-terminal memory devices is characterized by a second program voltage within a second range of program voltages, wherein the second plurality of two-terminal memory devices is associated with a third capacitance, and wherein the second plurality of two-terminal memory devices is selectively coupled in parallel between ground and a fifth common node;
- a second capacitor coupled between ground and a sixth common node;
- a second voltage source configured to provide a second input voltage, wherein the second input voltage is smaller than the second range of program voltages;
- a second operational amplifier including a second inverting input, a second non-inverting input, and a second output, wherein the second non-inverting input of the second operational amplifier is coupled to the second voltage source, wherein the second inverting input of the second operational amplifier is coupled to a seventh common node, and wherein the output of the second operational amplifier is coupled to an eighth common node; and
- a second resistance device coupled between the seventh common node and the eighth common node, wherein the fifth common node is coupled to the sixth common node and the seventh common node, wherein the first plurality of two-terminal memory devices is disposed on a first portion of a semiconductor wafer, wherein the second plurality of two-terminal memory devices is disposed on a second portion of the semiconductor wafer, and wherein the first portion is not adjacent to the second portion.

9. The device of claim 1, wherein the first operational amplifier is configured to oscillate at a first frequency in response to the first capacitance, the second capacitance and the first resistance.

10. The device of claim 9, further comprising a memory configured to store an indicator of the first frequency.

11. A method, comprising:
- closing a first switch and coupling a first plurality of two-terminal memory devices to an inverting input of a first operational amplifier, wherein each of the first plurality of two-terminal memory devices is characterized by a program voltage within a first range of program voltages, wherein a first capacitor is coupled between the inverting input of the first operational amplifier and ground, and wherein a first resistance device is coupled between the inverting input of the first operational amplifier and an output of the first operational amplifier;
- providing with a first voltage source, a first input voltage to a non-inverting input of the first operational amplifier, wherein the first input voltage is less than a minimum program voltage from the first range of program voltages;
- outputting with the first operational amplifier, a first signal, wherein the first signal is characterized by a first oscillating frequency, wherein the first oscillating frequency is responsive to a first capacitance associated with the first plurality of two-terminal memory devices;
- measuring a frequency value of the first oscillating frequency; and
- storing in a memory, an indicator associated with the first oscillating frequency measurement.

12. The method of claim 11, wherein the first plurality of two-terminal memory devices, the first switch, the first operational amplifier, the first capacitor, the first resistance device, and the first voltage source are formed within a first die of a plurality of dies formed on a semiconductor wafer.

13. The method of claim 12, wherein a second die from the plurality of dies comprises a second plurality of two-terminal memory devices, a second switch, a second operational amplifier, a second capacitor, a second resistance device, and a second voltage source; and wherein the method further comprises:
- closing the second switch and coupling the second plurality of two-terminal memory devices to an inverting input of the second operational amplifier, wherein each of the second plurality of two-terminal memory devices is characterized by a second program voltage within a second range of program voltages, wherein the second capacitor is coupled between the inverting input of the second operational amplifier and ground, and wherein the second resistance device is coupled between the inverting input of the second operational amplifier and an output of the second operational amplifier;
- providing with the second voltage source, a second input voltage to a non-inverting input of the second operational amplifier, wherein the second input voltage is less than a minimum program voltage from the second range of program voltages;
- outputting with the second operational amplifier, a second signal, wherein the second signal is characterized by a second oscillating frequency, wherein the second oscillating frequency is responsive to a second capacitance associated with the second plurality of two-terminal memory devices;
- measuring a second frequency value of the second oscillating frequency; and storing in a second memory, a second indicator associated with the second oscillating frequency.

14. The method of claim 13, further comprising, determining a pass condition for the semiconductor wafer when a difference between the frequency value of the first oscillating frequency and the second frequency value of the second oscillating frequency is within a predetermined range of frequencies.

15. The method of claim 11, further comprising:
providing with the first voltage source, a second input voltage to the non-inverting input of the first operational amplifier, wherein the second input voltage is less than the minimum program voltage from the first range of program voltages;
outputting with the first operational amplifier, a second signal, wherein the second signal is characterized by a second oscillating frequency, wherein the second oscillating frequency is responsive to the first capacitance associated with the first plurality of two-terminal memory devices;
measuring a second frequency value of the second oscillating frequency; and
storing in the memory, a second indicator associated with the second oscillating frequency.

16. The method of claim 15, further comprising determining a pass condition for the first plurality of two-terminal memory devices when a difference between the first oscillating frequency and the second oscillating frequency is within a predetermined range of frequencies.

17. The method of claim 15, wherein a difference between the first input voltage and the second input voltage is less than 0.5 volts.

18. The method of claim 11, further comprising:
modifying a trim value in response to the indicator associated with the first oscillating frequency; and
storing in the memory, the trim value, wherein the trim value is associated with a parameter associated with the first plurality of two-terminal memory devices, and wherein the parameter is selected from a group consisting of: a read parameter, a write parameter, and an erase parameter.

19. The method of claim 11, wherein a number of two-terminal memory devices in the first plurality of two-terminal memory devices is within a range of 20,000 to 60,000.

20. The method of claim 11, wherein the outputting with the first operational amplifier, the first signal, comprises:
outputting with the first operational amplifier a second signal, wherein the second signal is characterized by a second oscillating frequency; and
dividing the second oscillating frequency with a frequency divider to determine the first oscillating frequency.

* * * * *